(12) United States Patent
Kang et al.

(10) Patent No.: US 10,290,240 B2
(45) Date of Patent: May 14, 2019

(54) DISPLAY DEVICE

(71) Applicant: LG ELECTRONICS INC., Seoul (KR)

(72) Inventors: Kitae Kang, Seoul (KR); Jinha Heo, Seoul (KR); Dohyeon Kim, Seoul (KR); Choonghwoan Lee, Seoul (KR); Soonhwang Kwon, Seoul (KR); Deogjin Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 50 days.

(21) Appl. No.: 15/590,993

(22) Filed: May 9, 2017

(65) Prior Publication Data

US 2017/0347466 A1 Nov. 30, 2017

Related U.S. Application Data

(60) Provisional application No. 62/342,211, filed on May 27, 2016.

(30) Foreign Application Priority Data

Jul. 28, 2016 (KR) ........................ 10-2016-0096004

(51) Int. Cl.
*G09F 9/30* (2006.01)
*G06F 1/16* (2006.01)
*H05K 5/00* (2006.01)
*H05K 5/02* (2006.01)
*H01L 51/52* (2006.01)
(Continued)

(52) U.S. Cl.
CPC ............ *G09F 9/301* (2013.01); *G06F 1/1652* (2013.01); *G09G 3/20* (2013.01); *G09G 5/003* (2013.01); *H01L 51/5237* (2013.01); *H05K 5/0017* (2013.01); *H05K 5/0217* (2013.01); *H05K 5/0226* (2013.01); *G09G 2320/08* (2013.01);
(Continued)

(58) Field of Classification Search
CPC ...................................................... G09F 9/301
USPC ....................................................... 359/451
See application file for complete search history.

(56) References Cited

U.S. PATENT DOCUMENTS 9,727,080 B2 * 8/2017 Jung .................... G06F 1/1601
2014/0153266 A1 6/2014 Kim
(Continued)

FOREIGN PATENT DOCUMENTS

CN 105023510 11/2015
CN 105044957 11/2015
(Continued)

OTHER PUBLICATIONS

European Patent Office Application Serial No. 17172473.5, Search Report dated Nov. 2, 2017, 16 pages.
(Continued)

*Primary Examiner* — Christopher E Mahoney
(74) *Attorney, Agent, or Firm* — Lee, Hong, Degerman, Kang & Waimey PC

(57) ABSTRACT

A display device is disclosed. The display device includes a flexible display panel, a flexible plate positioned at a rear of the flexible display panel, a rigid bar adjacent to an edge of a back surface of the flexible plate, a drive unit installed to a rear of the flexible plate, and a wing plate connecting the drive unit to the rigid bar and hinge-coupled to the rigid bar.

19 Claims, 26 Drawing Sheets

(51) Int. Cl.
  *G09G 3/20* (2006.01)
  *G09G 5/00* (2006.01)
(52) U.S. Cl.
  CPC .. *G09G 2380/02* (2013.01); *H01L 2251/5338* (2013.01)

(56) References Cited

U.S. PATENT DOCUMENTS

| | | | |
|---|---|---|---|
| 2014/0198465 A1 | 7/2014 | Park | |
| 2015/0145837 A1* | 5/2015 | Park | H04N 5/64 345/184 |
| 2016/0127674 A1* | 5/2016 | Kim | G09G 5/003 348/739 |
| 2016/0324017 A1* | 11/2016 | Cho | H02K 7/00 |
| 2016/0334836 A1* | 11/2016 | Hong | G06F 1/1616 |
| 2016/0353588 A1* | 12/2016 | Kim | G09F 9/301 |
| 2017/0124937 A1* | 5/2017 | Kim | G09G 3/2096 |
| 2018/0114471 A1* | 4/2018 | Park | G09F 9/301 |
| 2018/0220537 A1* | 8/2018 | Heo | G06F 3/1446 |

FOREIGN PATENT DOCUMENTS

| | | |
|---|---|---|
| CN | 105578226 | 5/2016 |
| EP | 3016098 | 5/2016 |
| KR | 20150081228 | 7/2015 |
| KR | 20150109046 | 10/2015 |
| KR | 20150134825 | 12/2015 |
| WO | 2015102438 | 7/2015 |

OTHER PUBLICATIONS

European Patent Office Application Serial No. 17172473.5, Search Report dated Jul. 27, 2017, 13 pages.
Korean Intellectual Property Office Application No. 10-2006-0096004, Notice of Allowance dated Oct. 6, 2016, 5 pages.
The State Intellectual Property Office of the People's Republic of China Application Serial No. 201710383189.0, Office Action dated Jan. 17, 2019, 10 pages.

* cited by examiner

DISPLAY DEVICE

Pursuant to 35 U.S.C. § 119, this application claims the benefit of earlier filing date and right of priority to Korean Application No. 10-2016-0096004, filed on Jul. 28, 2016, and also claims the benefit of U.S. Provisional Application No. 62/342,211, filed on May 27, 2016, the contents of which are all incorporated by reference herein in their entirety.

BACKGROUND OF THE INVENTION

Field of the Invention

The present disclosure relates to a display device. More specifically, the present disclosure relates to a display device for changing a curvature of a display in concavity or convexity.

Discussion of the Related Art

With the development of the information society, various demands for display devices have been increasing. Various display devices, such as liquid crystal displays (LCDs), plasma display panels (PDPs), electroluminescent displays (ELDs), vacuum fluorescent displays (VFDs), and organic light emitting diode (OLED) displays, have been recently studied and used to meet various demands for the display devices.

An OLED display panel may display an image by depositing an organic material layer having self-emission structure on a substrate including transparent electrodes. The OLED display panel may be thin and flexible. Many studies on structural characteristics of display devices including the OLED display panel have been carried out.

SUMMARY OF THE INVENTION

Accordingly, an object of the present disclosure is to provide a display device having an open frame structure, in which a curvature of a display can be freely changed.

Another aspect of the present disclosure is to provide a display device having a drive mechanism, in which a curvature of a display can be freely changed.

Another aspect of the present disclosure is to provide a display device capable of preventing a damage of a display panel when a curvature of a display is changed.

In one aspect, there is provided a display device including a flexible display panel, a flexible plate at a rear of the flexible display panel, a rigid bar adjacent to an edge of a back surface of the flexible plate, a drive unit installed to a rear of the flexible plate, and a wing plate connecting the drive unit to the rigid bar and hinge-coupled to the rigid bar.

According to another aspect of the present disclosure, the display device may further include a side frame between the flexible display panel and the rigid bar.

According to another aspect of the present disclosure, the drive unit may provide an attraction force or a repulsion force for the side frame.

According to another aspect of the present disclosure, the side frame and a side of the flexible plate may form a gap.

According to another aspect of the present disclosure, the gap may increase when the drive unit provides the repulsion force, and may decrease when the drive unit provides the attraction force.

According to another aspect of the present disclosure, the drive unit may provide an attraction force or a repulsion force for the rigid bar through the wing plate.

According to another aspect of the present disclosure, when the drive unit provides the attraction force, both ends of the flexible display panel or both ends of the flexible plate may protrude backward.

According to another aspect of the present disclosure, when the drive unit provides the repulsion force, both ends of the flexible display panel or both ends of the flexible plate may protrude forward.

According to another aspect of the present disclosure, the display device may further include a side frame between the flexible display panel and the rigid bar. The flexible plate may include a boss that is formed on the back surface of the flexible plate and is positioned adjacent to the rigid bar. The side frame may include a groove at a location opposite the boss.

According to another aspect of the present disclosure, the drive unit may provide an attraction force or a repulsion force for the rigid bar through the wing plate. When the drive unit provides the attraction force, the boss may be close to the groove. When the drive unit provides the repulsion force, the boss may be far away from the groove.

According to another aspect of the present disclosure, the display device may further include a side frame between the flexible display panel and the rigid bar. The side frame may include a guide groove that is extended along a longitudinal direction of the wing plate. The flexible plate may include a guide pin that is formed on the back surface of the flexible plate and is inserted into the guide groove.

According to another aspect of the present disclosure, the drive unit may provide an attraction force or a repulsion force for the rigid bar through the wing plate. When the drive unit provides the attraction force, the guide pin may be close to an end of the guide groove. When the drive unit provides the repulsion force, the guide pin may be close to another end of the guide groove.

According to another aspect of the present disclosure, the display device may further include a center rigid bar between the flexible plate and the drive unit.

According to another aspect of the present disclosure, the drive unit may include a housing, a guide rail installed to the housing, a slider performing a linear motion on the guide rail, and a lead shaft that is mounted on the housing, penetrates the slider, and is screw-coupled to the slider. The wing plate may be hinge-coupled to the slider.

According to another aspect of the present disclosure, the display device may further include a center rigid bar mounted on the back surface of the flexible plate. The drive unit may be mounted on the center rigid bar.

According to another aspect of the present disclosure, the display device may further include a side frame positioned on a side of the flexible plate and separated from the flexible plate. A portion of the flexible display panel may be fixed to a portion of a front surface of the flexible plate, and another portion of the flexible display panel may be fixed to the side frame.

According to another aspect of the present disclosure, the display device may further include a center adhesive member extended vertically in a center portion of the front surface of the flexible plate and fixed to the center portion, and a side adhesive member extendedly fixed to a front surface of the side frame. A back surface of the flexible display panel may be fixed to the center adhesive member and the side adhesive member.

According to another aspect of the present disclosure, the display device may further include a coupling member fixed to the front surface of the flexible plate, positioned between the center adhesive member and the side adhesive member, and having a magnetic force. The back surface of the flexible display panel may contact the coupling member.

According to another aspect of the present disclosure, the display device may further include a cable electrically connected to the flexible display panel. The flexible plate may include a slot, and the cable may be inserted into the slot.

According to another aspect of the present disclosure, the display device may further include a center rigid bar fixed to the back surface of the flexible plate and a controller installed to the center rigid bar. The cable may be electrically connected to the controller.

According to another aspect of the present disclosure, the display device may include a boss at the back surface of the flexible plate. The rigid bar may be fastened to the boss.

According to another aspect of the present disclosure, the wing plate may be fixed to the rigid bar by a hinge, and the rigid bar may be fixed to the boss by a fastening member.

According to at least one aspect of the present disclosure, the present disclosure can provide a display device having an open frame structure, in which a curvature of a display can be freely changed.

According to at least one aspect of the present disclosure, the present disclosure can provide a display device having a drive mechanism, in which a curvature of a display can be freely changed.

According to at least one aspect of the present disclosure, the present disclosure can provide a display device capable of preventing a damage of a display panel when a curvature of a display is changed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
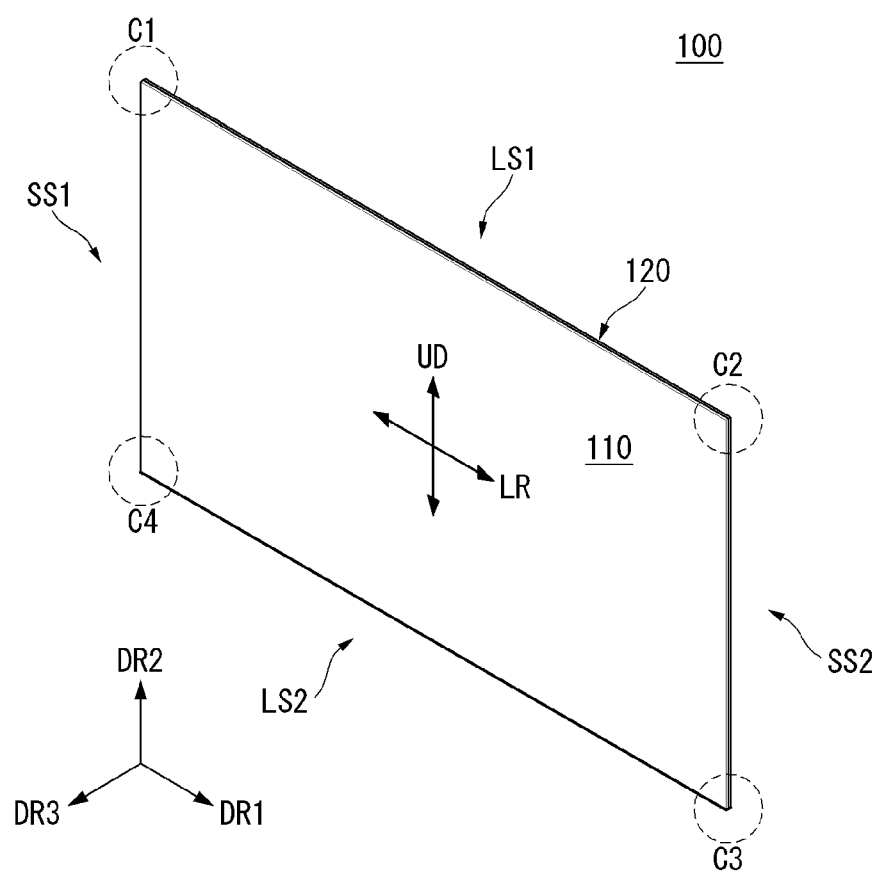
FIGS. 1 and 2 illustrate examples of a curvature variable display device according to an embodiment of the invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following embodiments of the invention are provided to those skilled in the art in order to describe the present invention more completely. Accordingly, shapes and sizes of elements shown in the drawings may be exaggerated for clarity.

Hereinafter, an embodiment of the invention is described using an organic light emitting diode (OLED) display panel as an example of a display panel. Other display panels may be used. For example, a plasma display panel (PDP), a field emission display (FED) panel, and a liquid crystal display panel may be used.

In what follows, a display device may include a first long side LS1, a second long side LS2 opposite the first long side LS1, a first short side SS1 adjacent to one end of the first long side LS1 and one end of the second long side LS2, and a second short side SS2 opposite the first short side SS1.

In the embodiment disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

The embodiment of the invention describes that lengths of the first and second long sides LS1 and LS2 are longer than lengths of the first and second short sides SS1 and SS2 for the sake of brevity and ease of reading. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display device, and a second direction DR2 may be a direction parallel to the short sides SS1 and SS2 of the display device.

A third direction DR3 may be a direction perpendicular to the first direction DR1 and/or the second direction DR2.

In the embodiment disclosed herein, the first direction DR1 and the second direction DR2 may be commonly referred to as a horizontal direction. Further, the third direction DR3 may be referred to as a vertical direction.

In another point of view, a side or a surface, on which the display device displays an image, may be referred to as a front side or a front surface. When the display device displays the image, a side or a surface, at which the image cannot be observed, may be referred to as a back side or a back surface. When the display device is observed at the front side or the front surface, the first long side LS1 may be referred to as an upper side or an upper surface. In the same manner as the first long side LS1, the second long side LS2 may be referred to as a lower side or a lower surface. Further, the first short side SS1 may be referred to as a left side or a left surface, and the second short side SS2 may be referred to as a right side or a right surface.

Further, the first long side LS1, the second long side LS2, the first short side SS1, and the second short side SS2 may be referred to as edges of the display device. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In the embodiment disclosed herein, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

Figure 2:
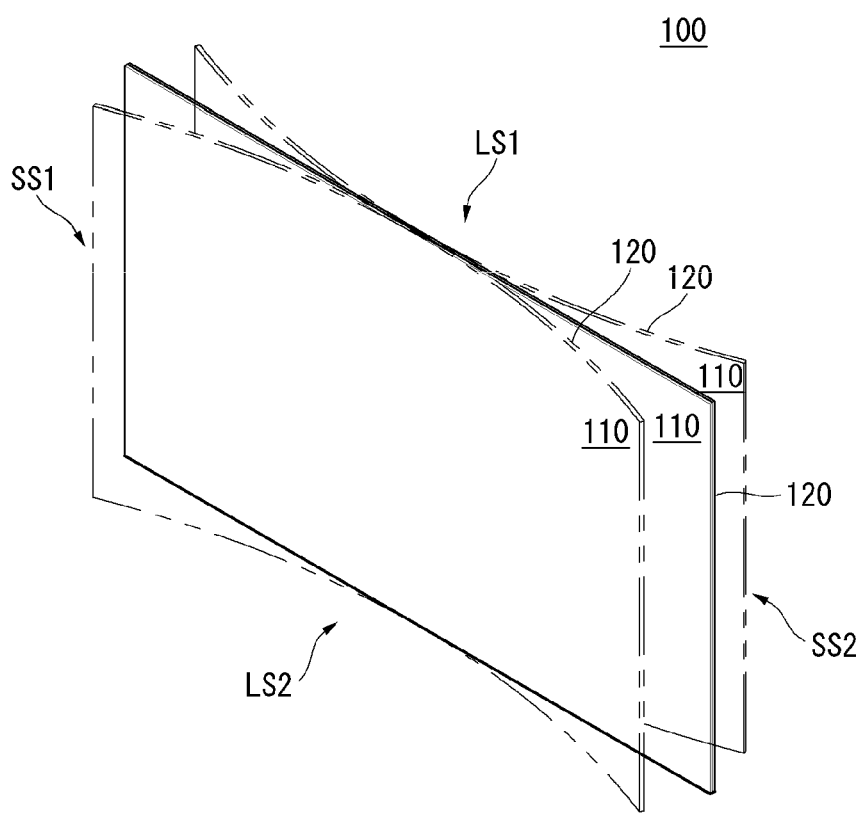

FIGS. 1 and 2 illustrate examples of a curvature variable display device according to an embodiment of the invention.

Referring to FIG. 1, a plate 120 may be a metal plate and may be flexible. Thus, the plate 120 may be referred to as a flexible plate. Alternatively, the plate 120 may be referred to as a frame. A display panel 110 may be positioned in front or on a front surface of the plate 120. The display panel 110 may be flexible. For example, the display panel 110 may be an OLED display panel.

The display panel 110 may be provided at a front surface of a display device 100 and may display an image. The display panel 110 may divide the image into a plurality of pixels and may output the image while controlling color, brightness, and chroma of each pixel. The display panel 110 may be divided into an active area, on which the image is displayed, and an inactive area, on which the image is not displayed. The display panel 110 may generate light corresponding to red, green, or blue color in response to a control signal.

Referring to FIG. 2, the display device 100 may have a variable curvature. The display device 100 may bend forward or backward. For example, when a user in front of the display device 100 watches an image, the display device 100 may be concavely curved. On the contrary, when the user in front of the display device 100 watches the image, the display device 100 may be convexly curved. In this instance, the plate 120 may bend at the same curvature as the display panel 110. In other words, the display panel 110 may bend at a curvature corresponding to a curvature of the plate 120.

Figure 3:
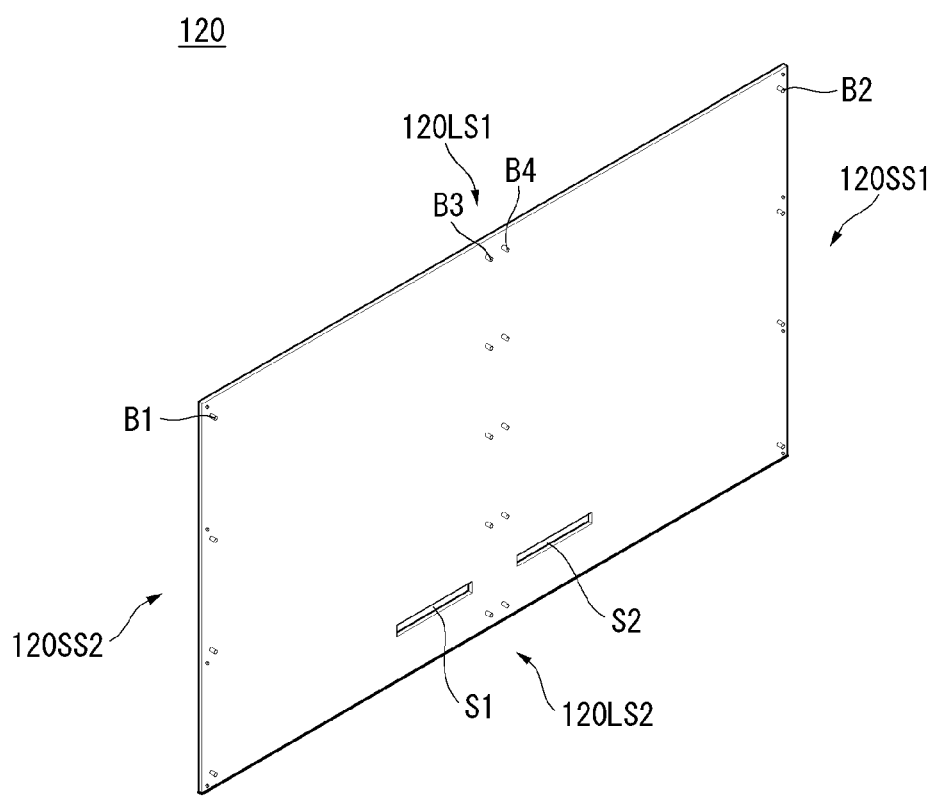
FIG. 3 illustrates an example of a plate according to an embodiment of the invention.

FIG. 3 illustrates an example of a plate according to an embodiment of the invention.

The plate 120 may include a boss on its back surface. A plurality of bosses B1, B2, B3, and B4 may be formed on the back surface of the plate 120. The plurality of bosses B1, B2, B3, and B4 may be disposed in the up-down direction of the plate 120.

For example, a plurality of first bosses B1 may be positioned adjacent to a second short side 120SS2 of the plate 120. The plurality of first bosses B1 may be arranged adjacent to the second short side 120SS2 of the plate 120 along the second short side 120SS2 (i.e., in the up-down direction UD) of the plate 120.

A plurality of second bosses B2 may be positioned adjacent to a first short side 120SS1 of the plate 120. The plurality of second bosses B2 may be arranged adjacent to the first short side 120SS1 of the plate 120 along the first short side 120SS1 (i.e., in the up-down direction UD) of the plate 120.

A plurality of third bosses B3 may be positioned close to the center of the plate 120. The plurality of third bosses B3 may be positioned between the first short side 120SS1 and the second short side 120SS2 of the plate 120 along the first short side 120SS1 or the second short side 120SS2 (i.e., in the up-down direction UD) of the plate 120.

A plurality of fourth bosses B4 may be positioned close to the center of the plate 120. The plurality of fourth bosses B4 may be positioned adjacent to the third bosses B3 or in parallel with the third bosses B3. The plurality of fourth bosses B4 may be positioned between the first short side 120SS1 and the second short side 120SS2 of the plate 120 along the first short side 120SS1 or the second short side 120SS2 (i.e., in the up-down direction UD) of the plate 120.

The plate 120 may include slots S1 and S2. The slots S1 and S2 may be positioned close to the center of the plate 120 and pass through the plate 120. The slots S1 and S2 may include a plurality of slots. The slots S1 and S2 may be positioned on the center lower side of the plate 120. The first slot S1 may be positioned adjacent to a second long side 120LS2 of the plate 120, and the second slot S2 may be positioned adjacent to the second long side 120LS2 of the plate 120. The first slot S1 and the second slot S2 may be disposed in a line. Namely, the second slot S2 may be disposed along a longitudinal direction (i.e., the left-right direction LR) of the first slot S1.

FIGS. 4 to 11 illustrate examples of a flexible plate and a side frame according to an embodiment of the invention.

Figure 4:
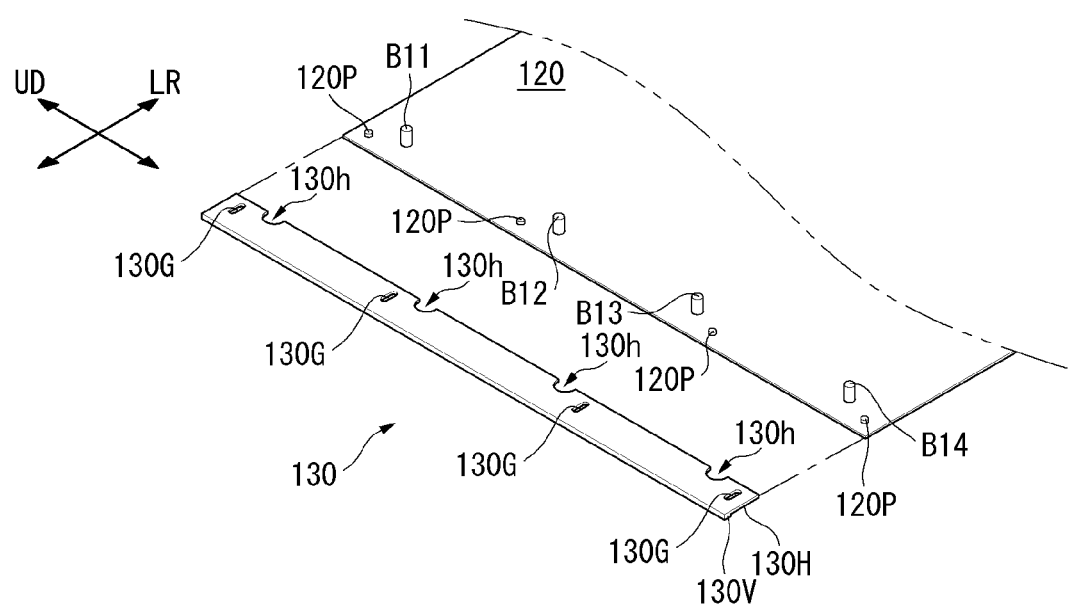
FIGS. 4 to 11 illustrate examples of a plate and a side frame according to an embodiment of the invention.

Referring to FIG. 4, a side frame 130 may be positioned on one side of the plate 120. The side frame 130 may be coupled to or mounted on one side of the plate 120. The side frame 130 may cover one side of the plate 120. The side frame 130 may move on one side of the plate 120.

The side frame 130 may be an extended bar or an extended bracket. The side frame 130 may include a horizontal portion 130H and a vertical portion 130V. The horizontal portion 130H may include a groove 130h or a plurality of grooves 130h. The groove 130h or the plurality of grooves 130h may be formed on one surface of the horizontal portion 130H or may penetrates the horizontal portion 130H.

The horizontal portion 130H may include a guide groove 130G or a plurality of guide grooves 130G. The guide groove 130G or the plurality of guide grooves 130G may be formed on the horizontal portion 130H along a longitudinal direction of the side frame 130. In this instance, the guide groove 130G may have a shape extended in a direction perpendicular to a longitudinal direction of the horizontal portion 130H. The guide groove 130G may have a shape extended along the left-right direction LR of the plate 120.

The plate 120 may include a guide pin 120P. The guide pin 120P may protrude from a back surface of the plate 120. In this instance, the guide pin 120P may be positioned adjacent to one side of the plate 120, and the one side of the plate 120 may be the short sides 120SS1 and 120SS2 of the plate 120. Alternatively, the guide pin 120P may be positioned adjacent to the long sides 120LS1 and 120LS2 of the plate 120. This may be determined depending on a formation direction of a curvature of the plate 120.

The guide groove 130G may be referred to as a coupling groove, and the guide pin 120P may be referred to as a coupling pin. The guide groove 130G and the guide pin 120P may be rivet-coupled to each other.

Figure 5:
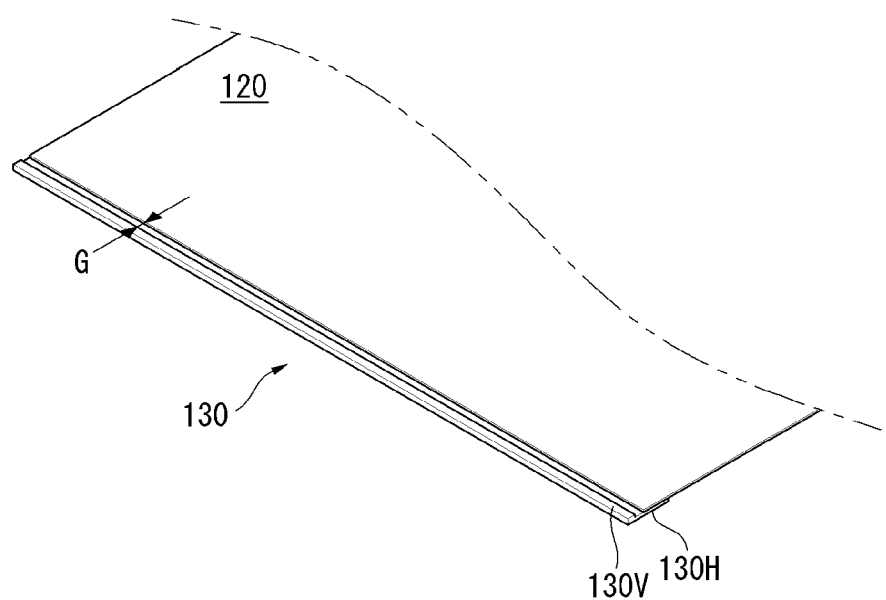
Figure 6:
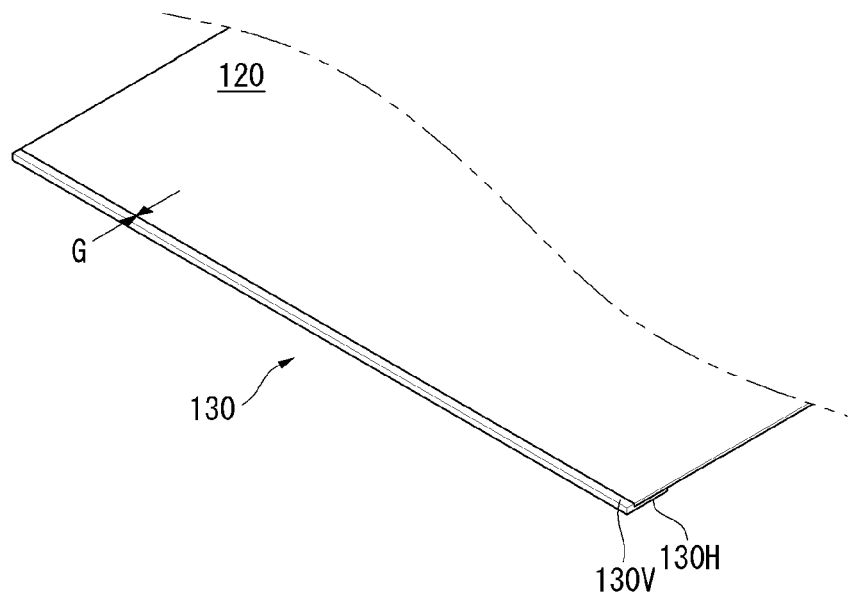

Referring to FIGS. 5 and 6, the side frame 130 may move on one side of the plate 120. The side frame 130 may be coupled to the first short side 120SS1 or the second short side 120SS2 of the plate 120. The side frame 130 may move on one side of the plate 120 while being coupled to the plate 120. The side frame 130 and the side of the plate 120 may form a gap G. A size of the gap G may change. Namely, a gap may be provided between the side frame 130 and the side of the plate 120.

Figure 7:
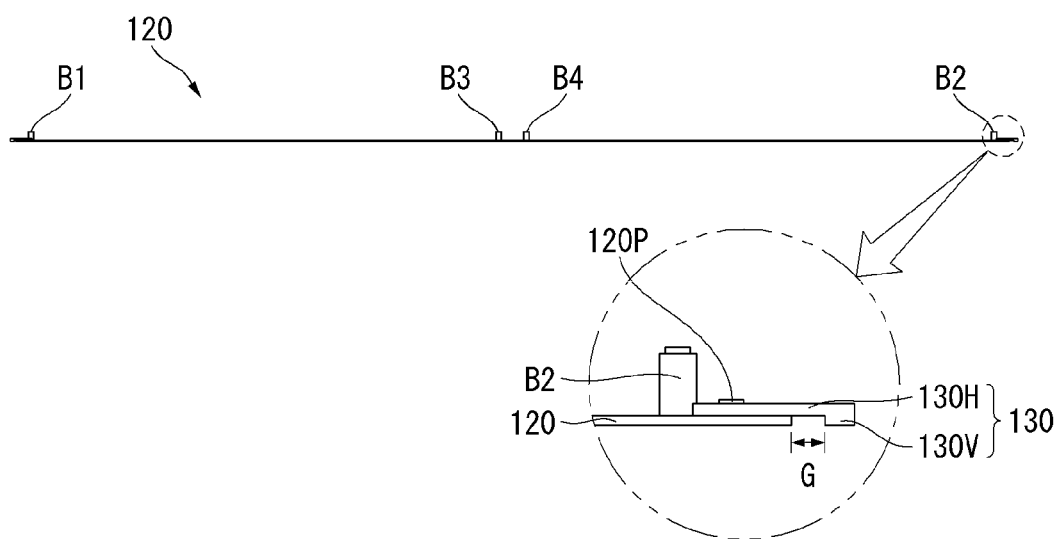
Figure 8:
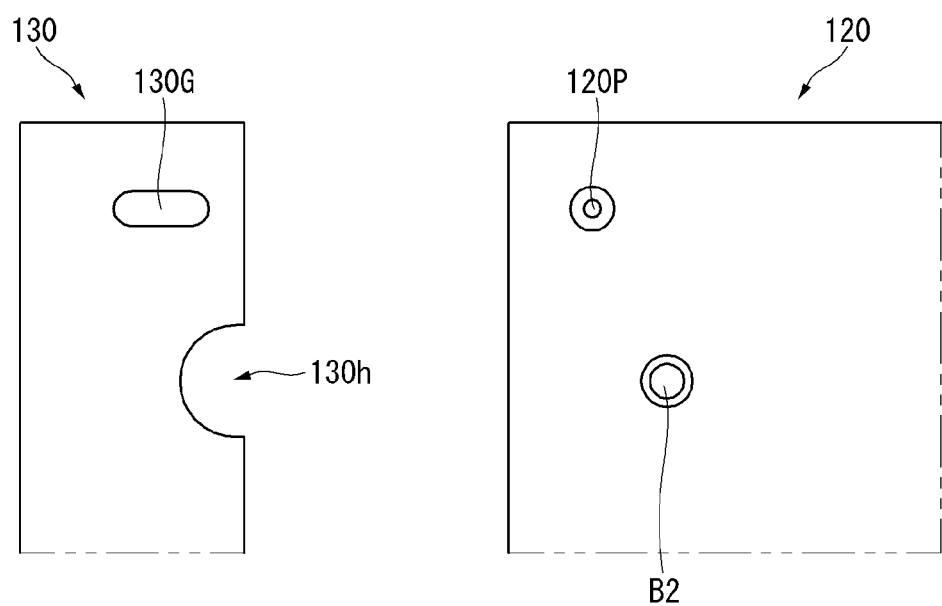

Referring to FIGS. 7 and 8, the side frame 130 may be coupled with the side of the plate 120. In this instance, the side frame 130 may move. The side frame 130 may be coupled with the side of the plate 120 by the coupling of the guide pin 120P and the guide groove 130G. In this instance, a boss B2 may be inserted into a groove 130h. This can prevent an interference or a collision of the boss B2 and the side frame 130 resulting from a movement of the side frame 130.

Figure 9:
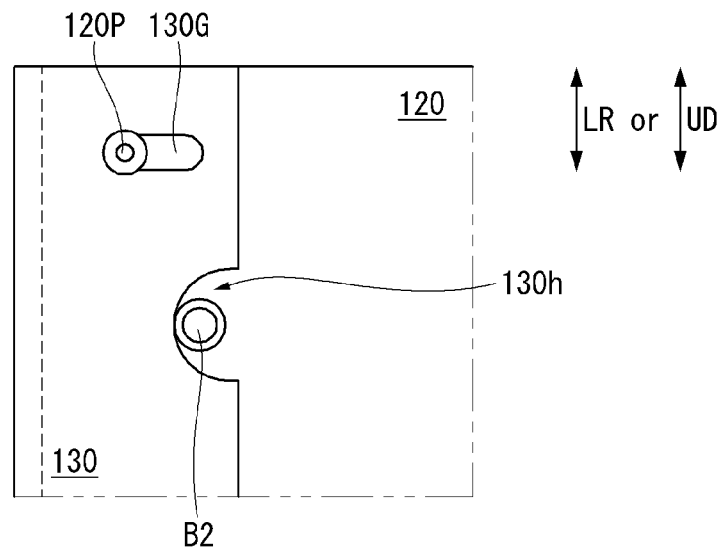
Figure 10:
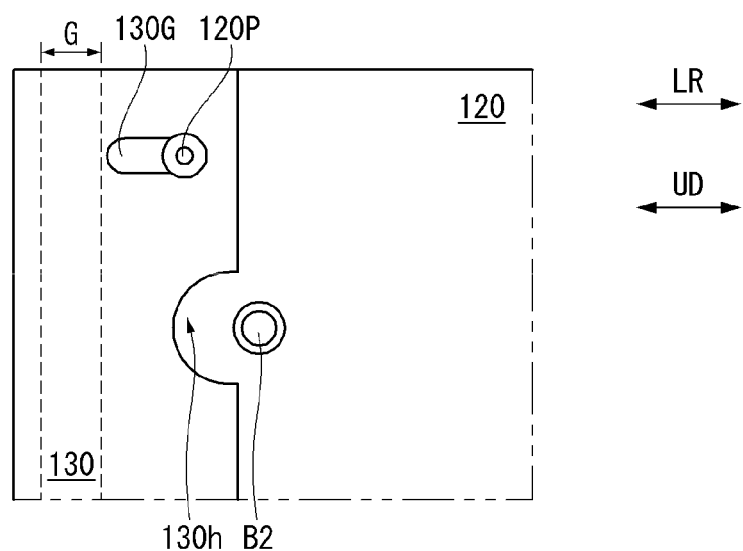

Referring to FIGS. 9 and 10, the side frame 130 may move in, for example, the left-right direction LR of the plate 120. Alternatively, the side frame 130 may move in, for example, the up-down direction UD of the plate 120. A size of a gap G may change depending on a movement of the side frame 130. Namely, a distance between the side frame 130 and the side of the plate 120 may change.

In this instance, the side frame 130 may move in a state where the guide pin 120P is inserted into the guide groove 130G. Hence, the guide pin 120P may slide on the guide groove 130G. In another point of view, the side frame 130 may be coupled with or mounted on the plate 120 by fastening the guide pin 120P to the guide groove 130G.

Figure 11:
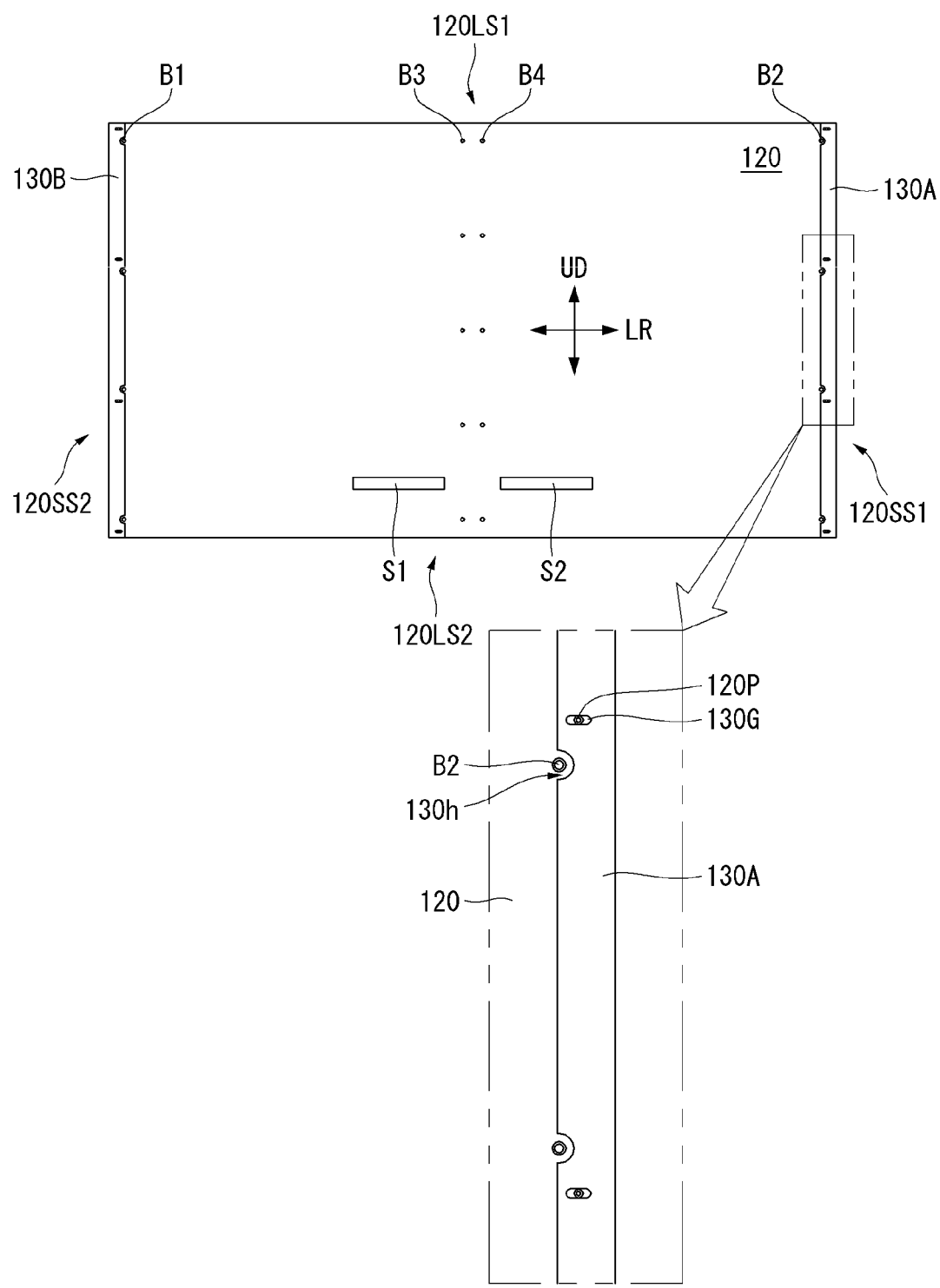

Referring to FIG. 11 that shows the back surface of the plate 120, a first side frame 130A may be positioned on the first short side 120SS1 of the plate 120, and a second side frame 130B may be positioned on the second short side 120SS2 of the plate 120. The first side frame 130A may be coupled with or mounted on the first short side 120SS1 of the plate 120, and thus may move. Further, the second side frame 130B may be coupled with or mounted on the second short side 120SS2 of the plate 120, and thus may move. In this instance, the side frames 130A and 130B may move in the left-right direction LR. Namely, the side frames 130A and 130B may provide a gap at the left side and/or the right side of the plate 120.

Figure 12:
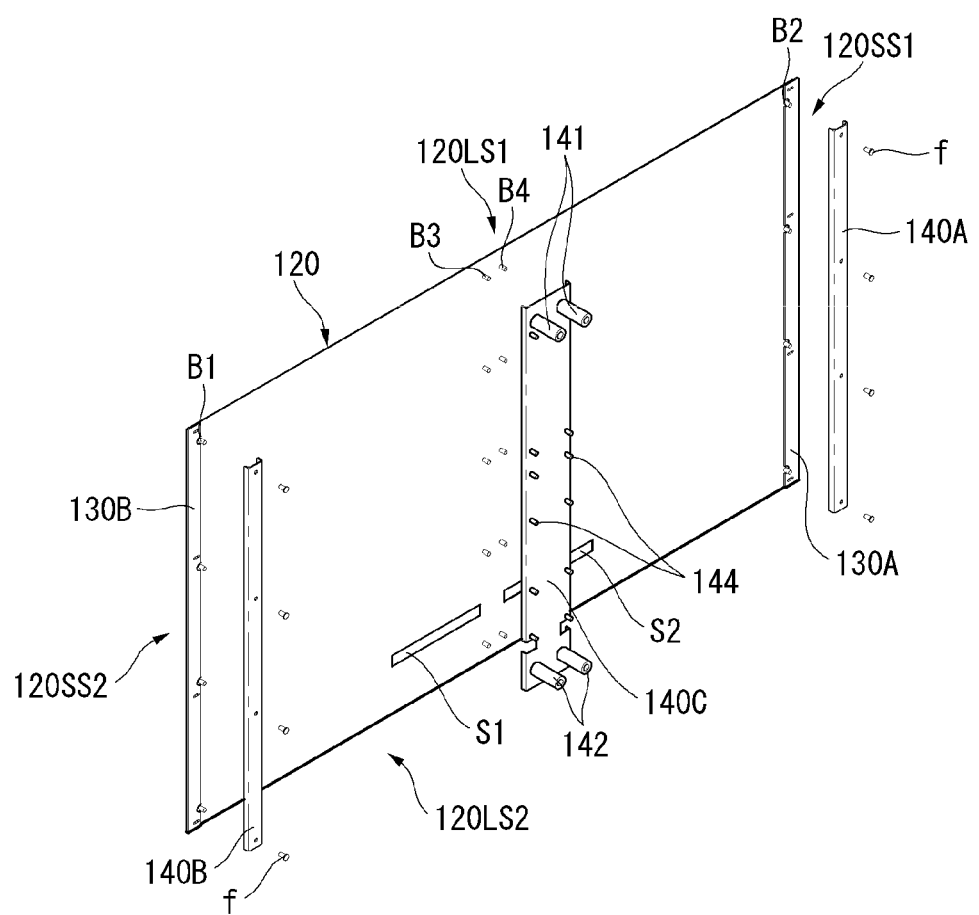
FIG. 12 illustrates an example of increasing rigidity of a curvature variable display device according to an embodiment of the invention.

FIG. 12 illustrates an example of increasing rigidity of a curvature variable display device according to an embodiment of the invention.

A first bar 140C may be mounted on the back surface of the plate 120. The first bar 140C may be fixed to the back surface of the plate 120. The first bar 140C may be disposed to be extended in the up-down direction UD of the plate 120. The first bar 140C may be referred to as a rigid bar or a center rigid bar. The first bar 140C may provide entire rigidity for the display device 100.

The first bar 140C may include a plurality of bosses 144 and fixing portions 141 and 142. The fixing portions 141 and 142 may be formed on a portion of an upper part or a lower part of the first bar 140C. The plurality of fixing portions 141 and 142 may be formed on a back surface of the first bar 140C.

The fixing portions 141 and 142 may be paired and may be formed on the back surface of the first bar 140C. For example, a pair of fixing portions 141 and 142 may be formed on an upper side of the back surface of the first bar 140C, and another pair of fixing portions 141 and 142 may be formed on a lower side of the back surface of the first bar 140C.

The fixing portions 141 and 142 may be used to fix the display device 100 to a wall or a structure. The plurality of bosses 144 may be used to mount the above-described components or components described below.

A height of the fixing portions 141 and 142 may be greater than a height of the plurality of bosses 144. Hence, even if the above-described components or the components described below are mounted on the plurality of bosses 144, the display device 100 may be fixed to the outside through the fixing portions 141 and 142.

A second bar 140A may be positioned on the back surface of the plate 120. The second bar 140A may be mounted on or fixed to the back surface of the plate 120 or a back surface of the first side frame 130A. The second bar 140A may be coupled with the first side frame 130A. The second bar 140A may be referred to as a rigid bar or a side rigid bar. The second bar 140A may provide the rigidity for the left side or the right side of the display device 100.

A third bar 140B may be positioned on the back surface of the plate 120. The third bar 140B may be mounted on or fixed to the back surface of the plate 120 or a back surface of the second side frame 130B. The third bar 140B may be coupled with the second side frame 130B. The third bar 140B may be referred to as a rigid bar or a side rigid bar. The third bar 140B may provide the rigidity for the left side or the right side of the display device 100.

The first bar 140C, the second bar 140A, and/or the third bar 140B may be fixed to the bosses B formed on the back surface of the plate 120. In this instance, the first, second, and third bars 140C, 140A, and 140B may be fixed to the bosses formed on the back surface of the plate 120 by fastening members "f".

FIGS. 13 to 19 illustrate examples of a drive mechanism of a curvature variable display device according to an embodiment of the invention.

Figure 13:
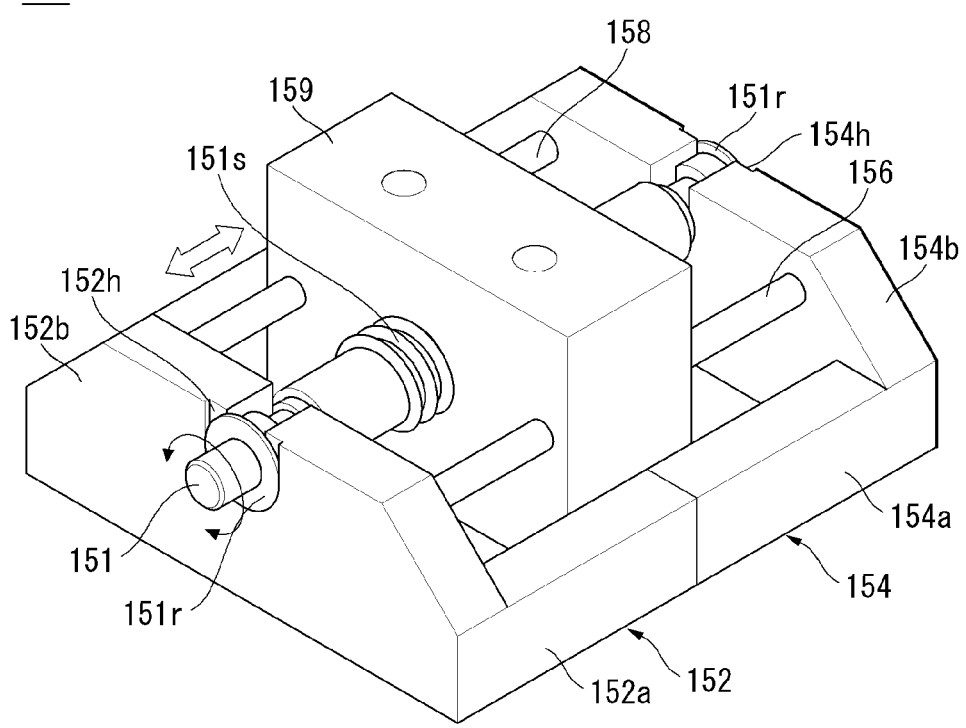
FIGS. 13 to 19 illustrate examples of a drive mechanism of a curvature variable display device according to an embodiment of the invention.

Referring to FIG. 13, a drive unit 150 may include housings 152 and 154, guides 156 and 158, a mover 159, and a lead screw 151.

The housings 152 and 154 may include a first housing 152 and a second housing 154. The first housing 152 may contact the second housing 154. The first housing 152 may include a horizontal portion 152a and a vertical portion 152b. The second housing 154 may include a horizontal portion 154a and a vertical portion 154b.

The horizontal portion 152a of the first housing 152 may contact the horizontal portion 154a of the second housing 154. In this instance, the horizontal portion 152a of the first housing 152 and the horizontal portion 154a of the second housing 154 may provide a predetermined distance between the vertical portion 152b of the first housing 152 and the vertical portion 154b of the second housing 154. Hence, the vertical portion 152b of the first housing 152 and the vertical portion 154b of the second housing 154 may be spaced apart from each other by the predetermined distance.

In other words, the vertical portion 152b of the first housing 152 may be disposed in parallel with the vertical portion 154b of the second housing 154. The horizontal portion 152a of the first housing 152 may be extended from the vertical portion 152b of the first housing 152, and the horizontal portion 154a of the second housing 154 may be extended from the vertical portion 154b of the second housing 154. The horizontal portion 152a of the first housing 152 may be extended toward the vertical portion 154b of the second housing 154, and the horizontal portion 154a of the second housing 154 may be extended toward the vertical portion 152b of the first housing 152.

One side of each of the guides 156 and 158 may be inserted into or fixed to the vertical portion 152b of the first housing 152, and the other side may be inserted into or fixed to the vertical portion 154b of the second housing 154. Namely, the guides 156 and 158 may connect the first housing 152 to the second housing 154. The guides 156 and 158 may be referred to as a shaft. Further, the guides 156 and 158 may be referred to as a rail.

The guides 156 and 158 may include a first guide 156 and a second guide 158. The first guide 156 may be disposed in parallel with the second guide 158 and may be spaced apart from the second guide 158. In other words, the first guide 156 and the second guide 158 may form a parallel bar.

The mover 159 may move on the guides 156 and 158. The first guide 156 and the second guide 158 may be inserted into the mover 159. In this instance, a gap may be formed between the first and second guides 156 and 158 and the mover 159. Namely, the mover 159 may move on the first and second guides 156 and 158. The mover 159 may be referred to as a slider.

The lead screw 151 may penetrate the mover 159. The lead screw 151 may be fixed to the vertical portion 152b of the first housing 152 and the vertical portion 154b of the second housing 154 so that the lead screw 151 can rotate at the vertical portions 152b and 154b. To this end, a first coupling 151r may be fixed to the vertical portion 152b of the first housing 152, a second coupling 151r may be fixed to the vertical portion 154b of the second housing 154, and the lead screw 151 may be inserted into the first coupling 151r and the second coupling 151r. The lead screw 151 may be referred to a lead shaft.

The lead screw 151 may be positioned between the first guide 156 and the second guide 158. The lead screw 151 may include a screw thread 151S. The screw thread 151S may be engaged with the mover 159. Namely, the lead screw 151 and the mover 159 may be screw-coupled to each other. The mover 159 may be referred to as a screw nut.

Hence, when the lead screw 151 rotates, the mover 159 may move between the first housing 152 and the second housing 154 while moving on the first guide 156 and the second guide 158. Namely, the lead screw 151 and the mover 159 may be coupled to each other and may convert a rotary motion into a linear motion.

The rotation of the lead screw 151 may be performed manually or automatically. The lead screw 151 may be connected to a motor for the automatic rotation of the lead screw 151. Further, the lead screw 151 may be rotated by an electric screwdriver or a spanner, etc.

Figure 14:
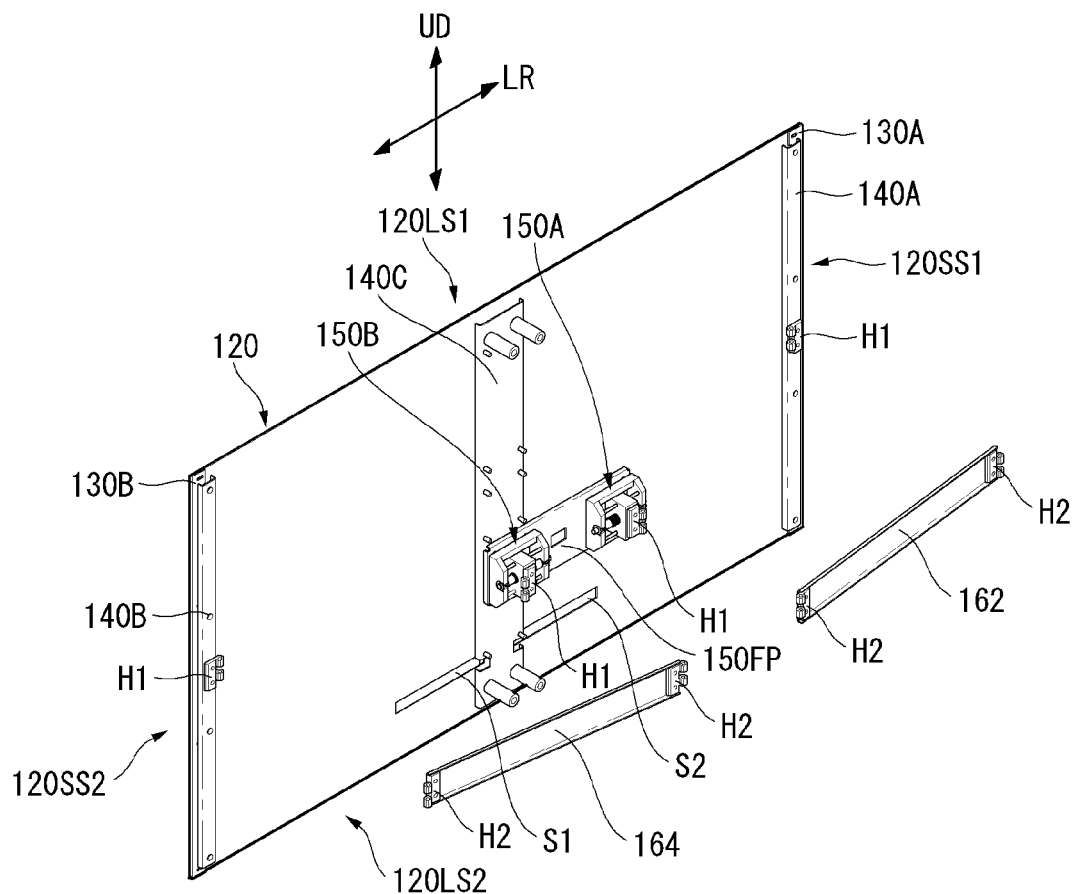

Referring to FIG. 14, a base 150FP may be mounted on or fixed to the first bar 140C. The base 150FP may be extended in the left-right direction LR of the plate 120. Namely, the base 150FP may be an extended plate. One side of the base 150FP may be adjacent to the first short side 120SS1 of the plate 120, and the other side may be adjacent to the second short side 120SS2 of the plate 120.

Drive units 150A and 150B may be installed on the base 150FP. In other words, the plurality of drive units 150A and 150B may be installed on the base 150FP. The plurality of drive units 150A and 150B may include a first drive unit 150A and a second drive unit 150B.

The first drive unit 150A may be mounted on or fixed to one side of the base 150FP, and the second drive unit 150B may be mounted on or fixed to the other side of the base 150FP. In other words, the first drive unit 150A may be disposed adjacent to the first short side 120SS1 of the plate 120, and the second drive unit 150B may be disposed adjacent to the second short side 120SS2 of the plate 120.

Wing plates 162 and 164 may connect the drive units 150A and 150B to one side of the plate 120. A formation position of the wing plates 162 and 164 may be sufficiently changed. The wing plates 162 and 164 may include a first wing plate 162 and a second wing plate 164.

One side of the first wing plate 162 may be connected to the first drive unit 150A, and one side of the second wing plate 164 may be connected to the second drive unit 150B.

Figure 15:
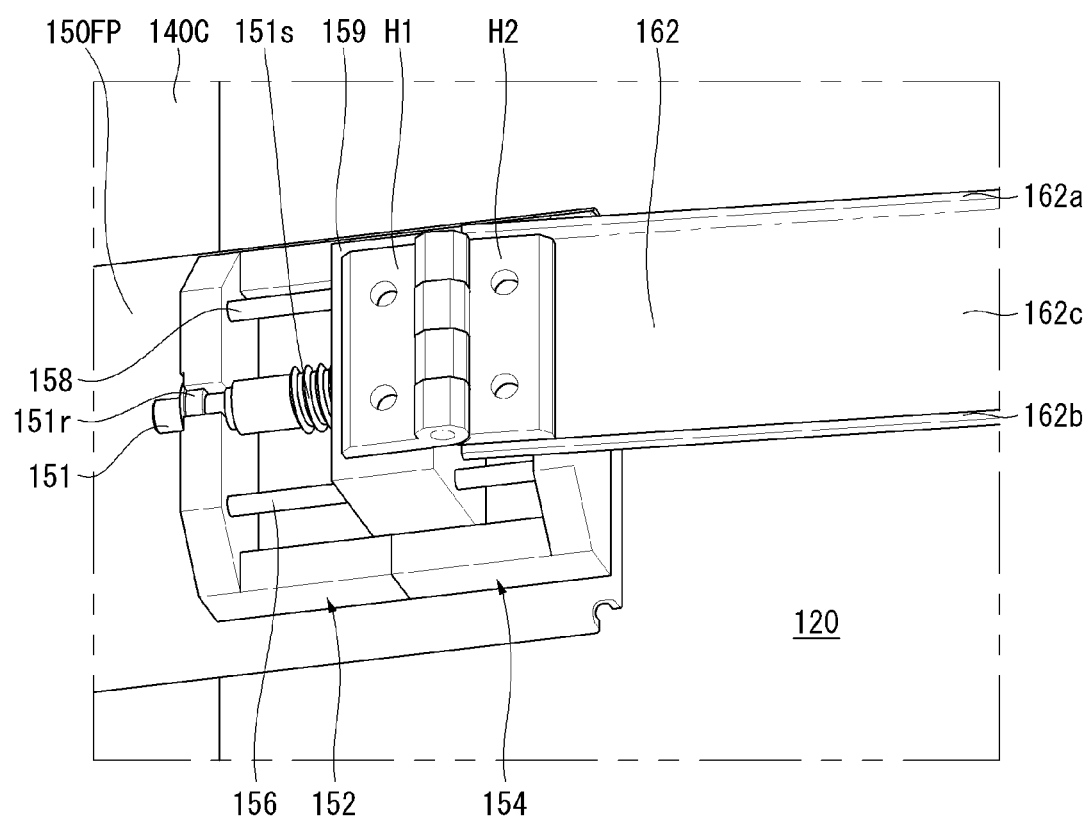
Figure 16:
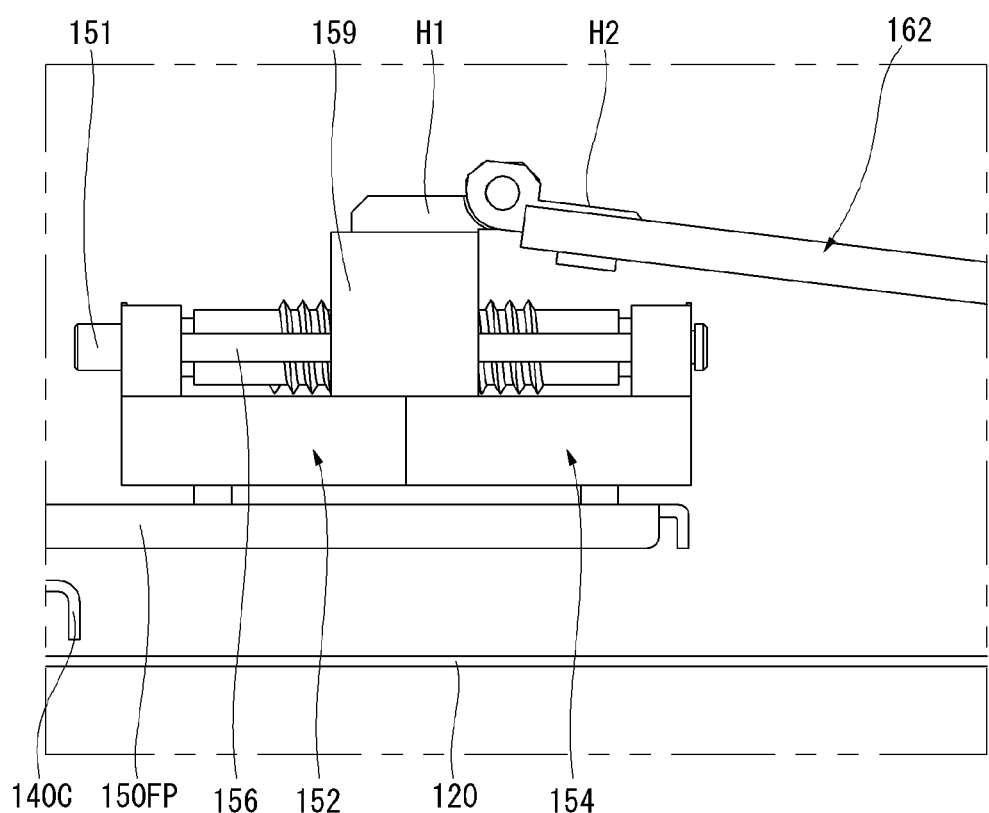

Referring to FIGS. 15 and 16, a hinge H1 may be connected, coupled, or fixed to an upper part of the mover 159. A hinge H2 may be connected, coupled, or fixed to an end of the wing plate 162. The wing plate 162 may be connected to the mover 159 by the hinge H2 and may perform a pivot motion from the mover 159. Hence, a curvature of the front surface of the display panel 110 or the plate 120 may change in concavity or convexity.

The wing plate 162 may include a flat portion 162c and side walls 162a and 162b so as to sufficiently secure the rigidity and prevent the bending. The side walls 162a and 162b may be extended from the flat portion 162c and bend. The plurality of side walls 162a and 162b may be disposed on the left and right sides of the flat portion 162c.

The flat portion 162c may be extended and may be entirely flat. The side walls 162a and 162b may be formed along a longitudinal direction of the flat portion 162c and bend from the flat portion 162c.

Figure 17:
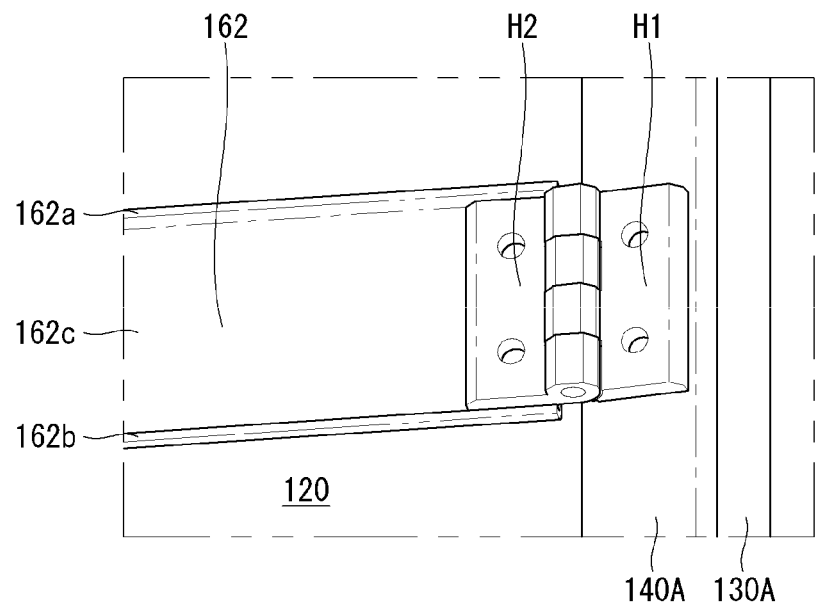
Figure 18:
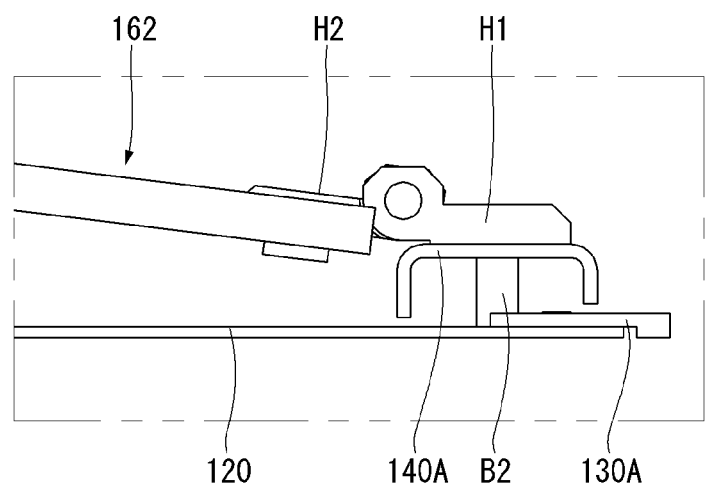

Referring to FIGS. 17 and 18, a hinge H1 may be connected, coupled, or fixed to an upper part of the second bar 140A. A hinge H2 may be connected, coupled, or fixed to an end of the wing plate 162. The wing plate 162 may be connected to the second bar 140A by the hinge H2 and may perform a pivot motion from the second bar 140A. Hence, a curvature of the front surface of the display panel 110 or the plate 120 may change in concavity or convexity.

Figure 19:
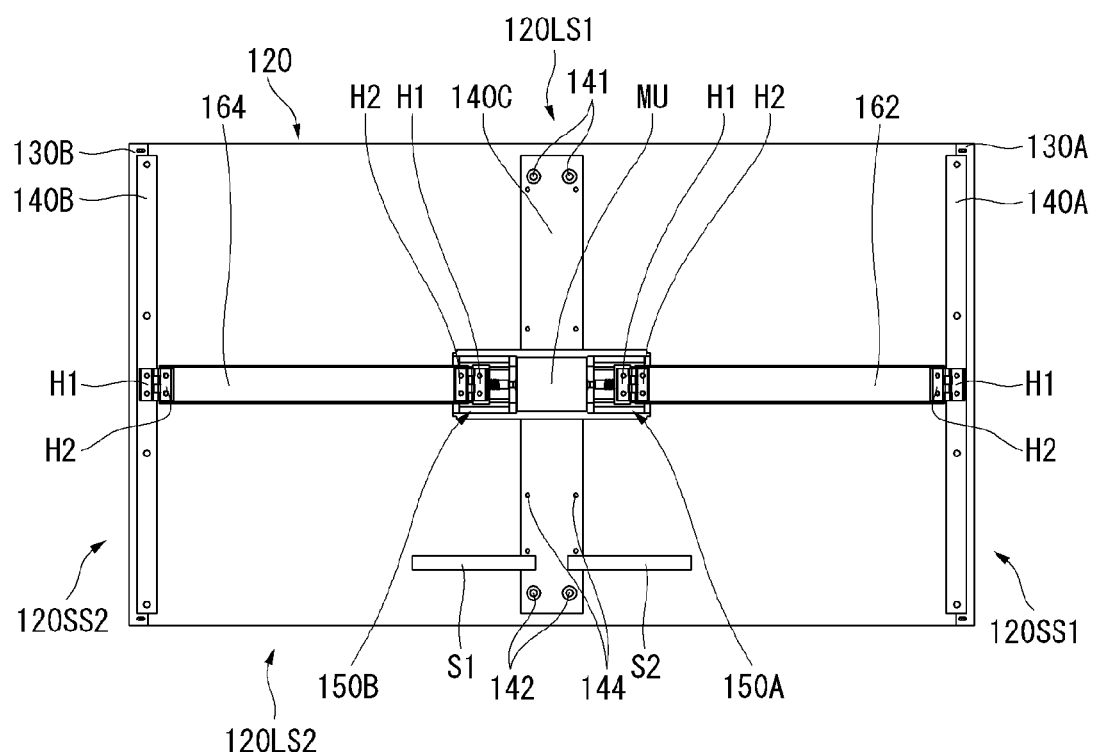

Referring to FIG. 19, a motor unit MU may be positioned between the first drive unit 150A and the second drive unit 150B and may be mounted on or fixed to the base 150FP. The motor unit MU may provide a rotary force (or a torque) for the first drive unit 150A and/or the second drive unit 150B.

Figure 20:
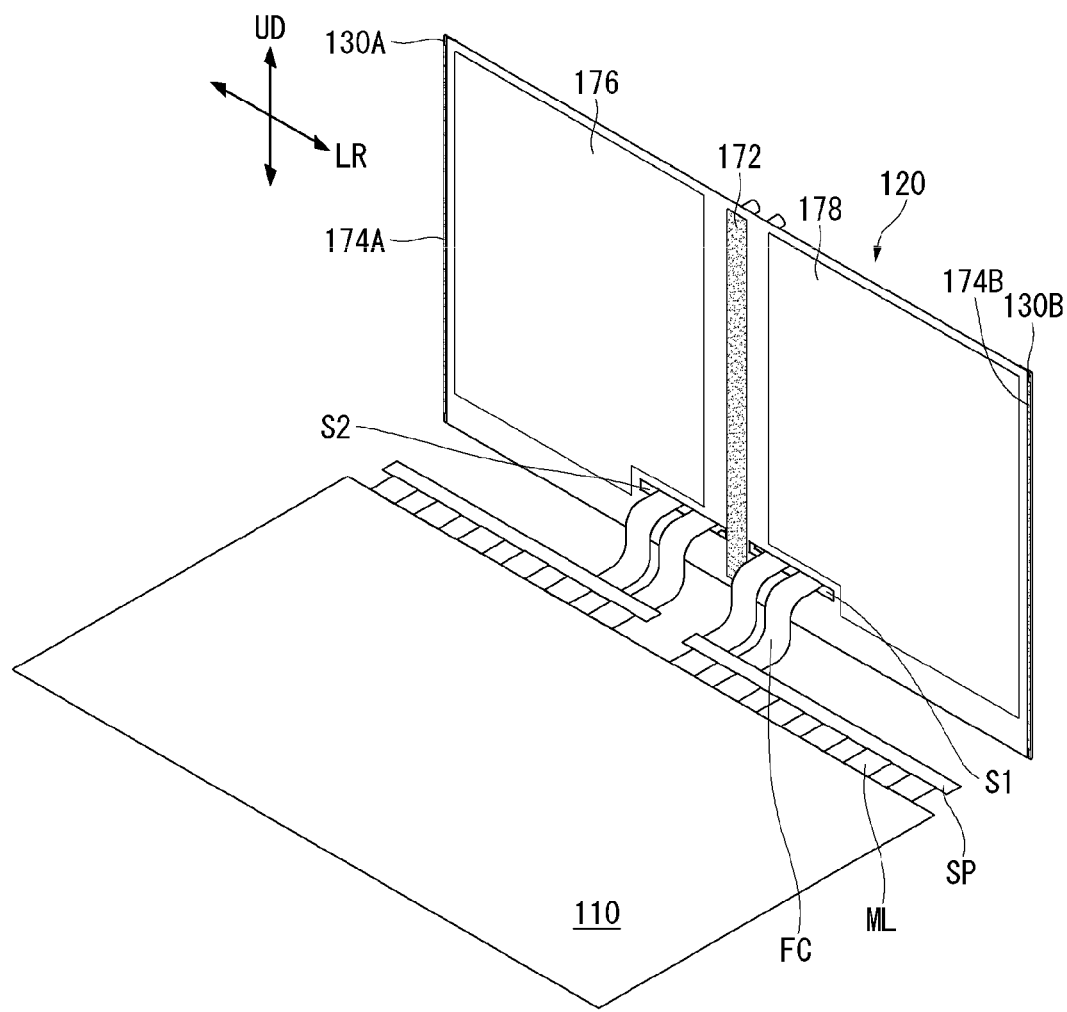
FIGS. 20 and 21 illustrate examples of coupling components of a display panel according to an embodiment of the invention.
Figure 21:
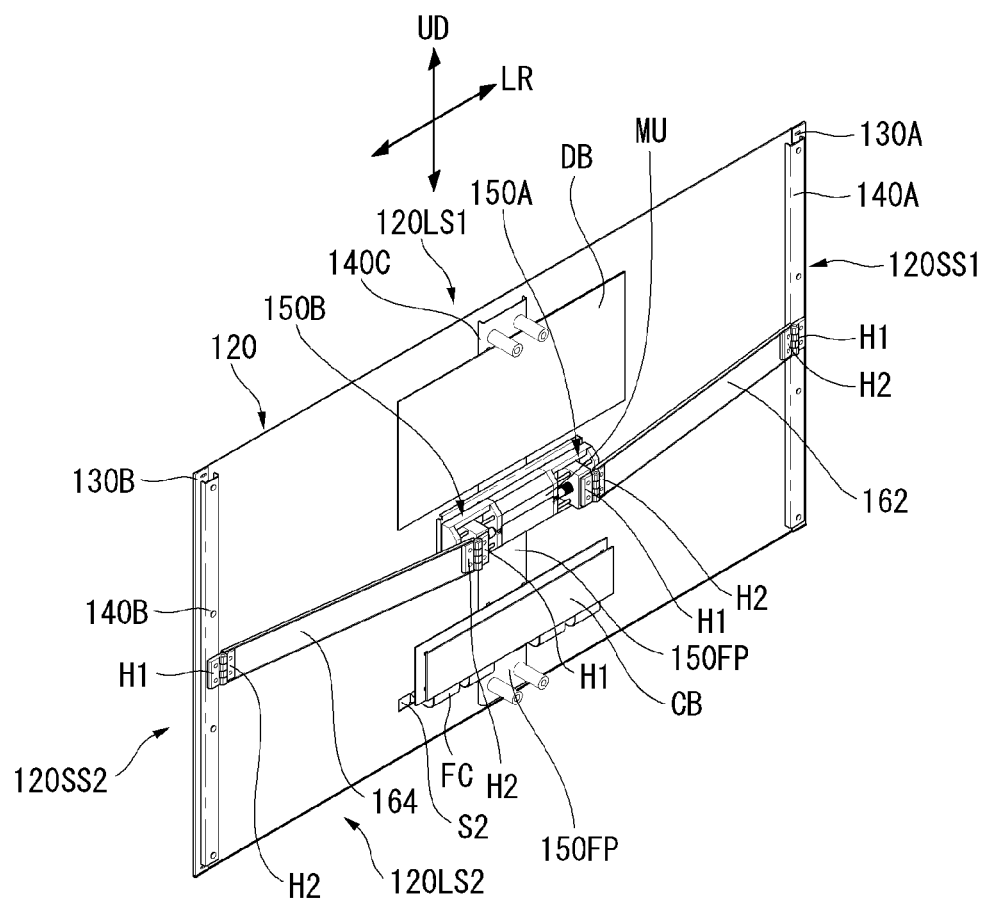

FIGS. 20 and 21 illustrate examples of coupling components of a display panel according to an embodiment of the invention.

Referring to FIG. 20, a center adhesive member 172 may be positioned on a front surface of the plate 120. The center adhesive member 172 may be fixed to a center portion of the plate 120. In this instance, the center adhesive member 172 may be extended in the up-down direction UD of the plate 120 and may be fixed in the up-down direction UD of the plate 120. For example, the center adhesive member 172 may be a double-sided tape.

A first adhesive member 174A may be attached to the first side frame 130A. The first adhesive member 174A may be fixed to a front surface of the first side frame 130A. The first adhesive member 174A may be extended along a longitudinal direction of the first side frame 130A. For example, the first adhesive member 174A may be a double-sided tape.

A second adhesive member 174B may be attached to the second side frame 130B. The second adhesive member 174B may be fixed to a front surface of the second side frame 130B. The second adhesive member 174B may be extended along a longitudinal direction of the second side frame 130B. For example, the second adhesive member 174B may be a double-sided tape.

The first adhesive member 174A and the second adhesive member 174B may be referred to as a side adhesive member.

Coupling members 176 and 178 may be positioned on the front surface of the plate 120. The first coupling member 176 may be positioned between the first side frame 130A and the center adhesive member 172. The first coupling member 176 may be magnetic. The second coupling member 178 may be positioned between the second side frame 130B and the center adhesive member 172. The second coupling member 178 may be magnetic. For example, the coupling members 176 and 178 may be magnets.

A member layer ML may be electrically connected to the display panel 110 and may be extended from the display panel 110. Examples of the member layer ML may include a chip-on film (COF), a chip-on glass (COG), a flexible printed circuit board (FPCB), a tape carrier package (TCP).

A printed circuit board (PCB) SP may be electrically connected to the member layer ML. In this instance, the PCB SP may combine the plurality of member layers ML. A cable (for example, flexible flat cable (FFC)) FC may be electrically connected to the PCB SP. The cable FC may be electrically connected to controllers CB and DB positioned in the rear of the plate 120. To this end, the cable FC may be inserted into the slots S1 and S2.

The display panel 110 may be positioned in front of the plate 120. The display panel 110 may be fixed or coupled to the front surface of the plate 120. In this instance, the display panel 110 may be fixed to the front surface of the plate 120 by the adhesive members 172, 174A, and 174B.

A center portion of the display panel 110 may be attached to the center adhesive member 172. Both portions of the display panel 110 may be attached to the first and second adhesive members 174A and 174B. The display panel 110 does not move on the plate 120 in a horizontal or vertical direction through the above-described attachment and may be fixed to the plate 120.

In another embodiment, the display panel 110 may be coupled to the front surface of the plate 120 by the coupling members 176 and 178. In this instance, the display panel 110 may be coupled to the front surface of the plate 120 by a magnetic force and may move on the plate 120 in the horizontal or vertical direction. Namely, the display panel 110 coupled with the front surface of the plate 120 may flexibly respond to a slight movement. In other words, the embodiment of the invention may flexibly respond to changes in a curvature of the display pane 110 and/or the plate 120.

Referring to FIG. 21, the controllers CB and DB may be installed on the first bar 140C. The controllers CB and DB may include a main board DB, a timing controller (T-CON) board CB, etc. For example, the main board DB may be installed on an upper part of the first bar 140C, and the T-CON board CB may be installed on a lower part of the first bar 140C. In this instance, the main board DB and the T-CON board CB may be electrically connected. The cable FC may be electrically connected to the controllers CB and DB through the slots S1 and S2. For example, the cable FC may be electrically connected to the T-CON board CB.

FIGS. 22 to 25 illustrate examples of a movement of a side frame depending on changes in a curvature of a display panel according to an embodiment of the invention.

Figure 22:
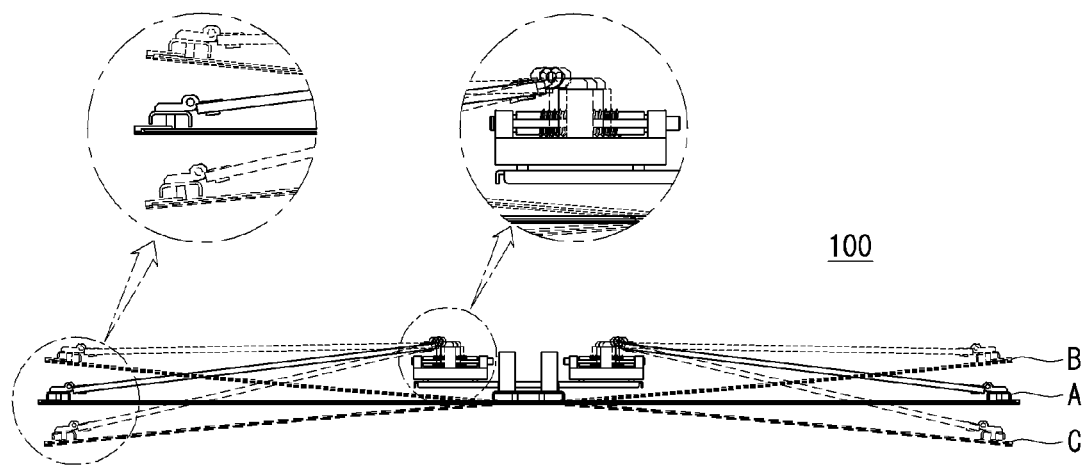
FIGS. 22 to 25 illustrate examples of a movement of a side frame depending on changes in a curvature of a display panel according to an embodiment of the invention.
Figure 23:
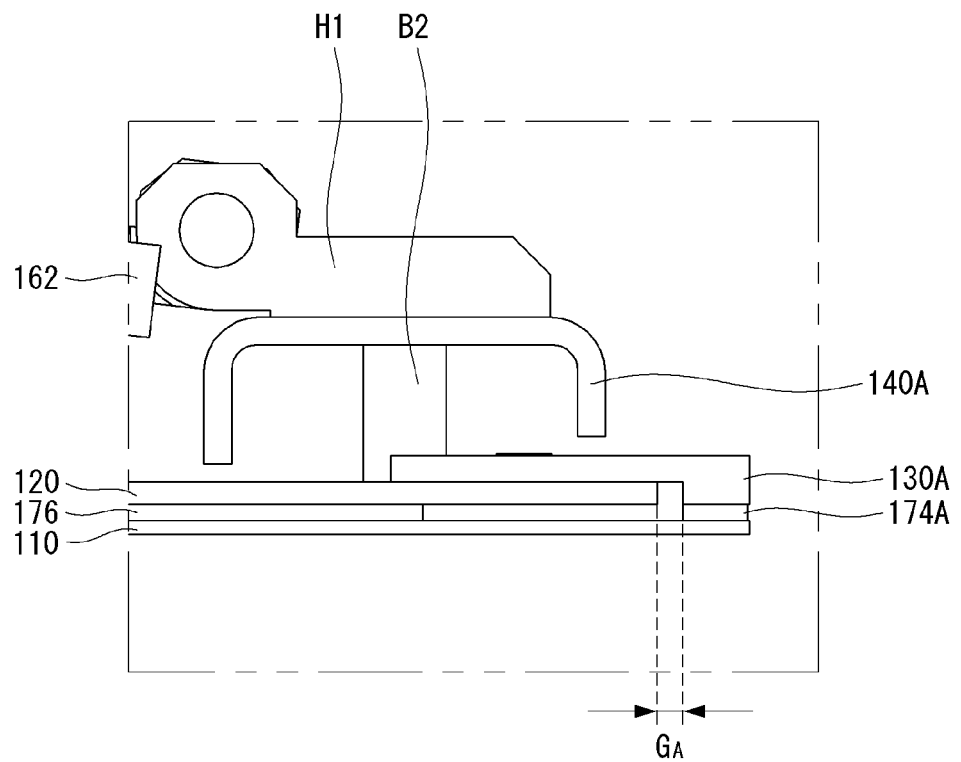

Referring to FIGS. 22 and 23, the display panel 110 or the plate 120 may be in a flat state (see "A" in FIG. 22). The second bar 120A may be fixed to the back surface of the plate 120. The boss B2 may be formed on the back surface of the plate 120, and the second bar 120A may be coupled or fixed to the boss B2. The wing plate 162 may be coupled or fixed to the second bar 120A by the hinge H1.

The first side frame 130A may be coupled to the plate 120 so that the first side frame 130A is movable on the plate 120. A gap $G_A$ may be formed between the plate 120 and the first side frame 130A. A portion of the back surface of the display panel 110 may be coupled or fixed to a portion of the front surface of the first side frame 130A by the first adhesive member 174A.

Figure 24:
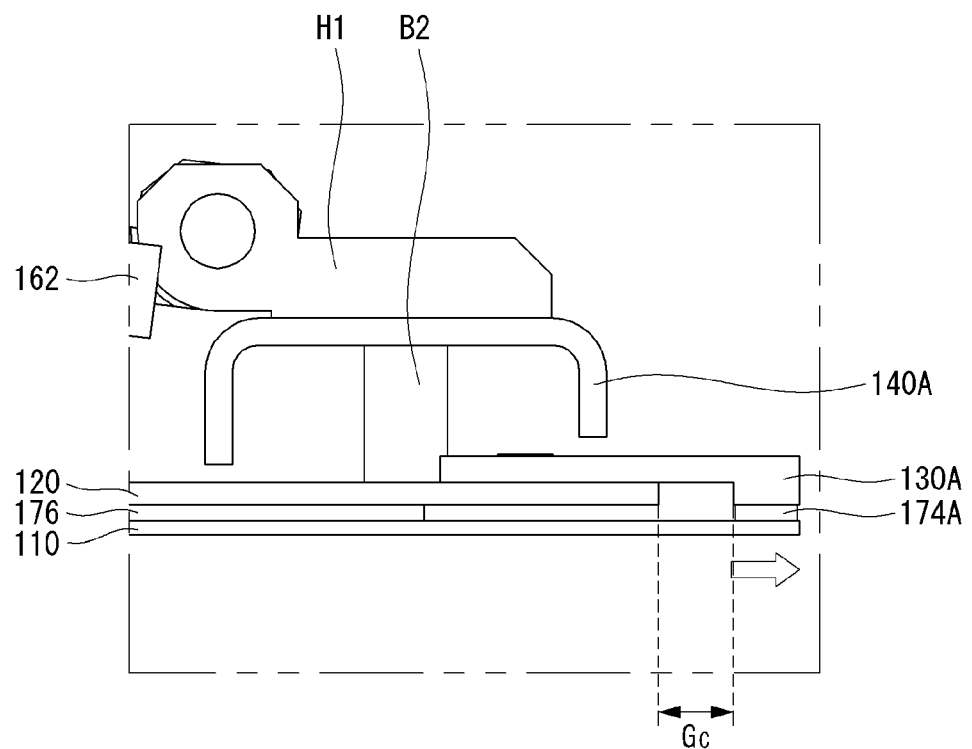

Referring to FIGS. 22 and 24, a curvature of the display panel 110 or the plate 120 may change by a movement of the wing plate 162. In this instance, the front surface of the display panel 110 or the plate 120 may be in a concave state (see "C" in FIG. 22). Further, a curvature of the display panel 110 may change, and at the same time a curvature of the plate 120 may change. Namely, a position of both ends of the display panel 110 and a position of both ends of the plate 120 may relatively change. Because the side frame 130A may move while being fixed to one end or both ends of the display panel 110, the side frame 130A may cover changes in a relative position between the display panel 110 and the plate 120 at one end or both ends.

In other words, when the front surface of the display panel 110 becomes concave by the movement of the wing plate 162, the front surface of the plate 120 may become concave. In this instance, one end or both ends of the display panel 110 may be positioned further to the outside of the display device 100 than one end or both ends of the display panel 110 in a flat state. To this end, the side frame 130A may move far away from the plate 120, and a gap Gc between the side frame 130A and the plate 120 may increase compared to when the display panel 110 is in a flat state.

In spite of the changes in the curvature of the display panel 110 or the plate 120, the display panel 110 can be prevented from being damaged and can maintain a smooth curved surface by such a mechanism. Further, the wing plate 162 can increase a movable range of the changes in the curvature of the display panel 110 or the plate 120 because the hinge H1 is connected to the second bar 140A.

Figure 25:
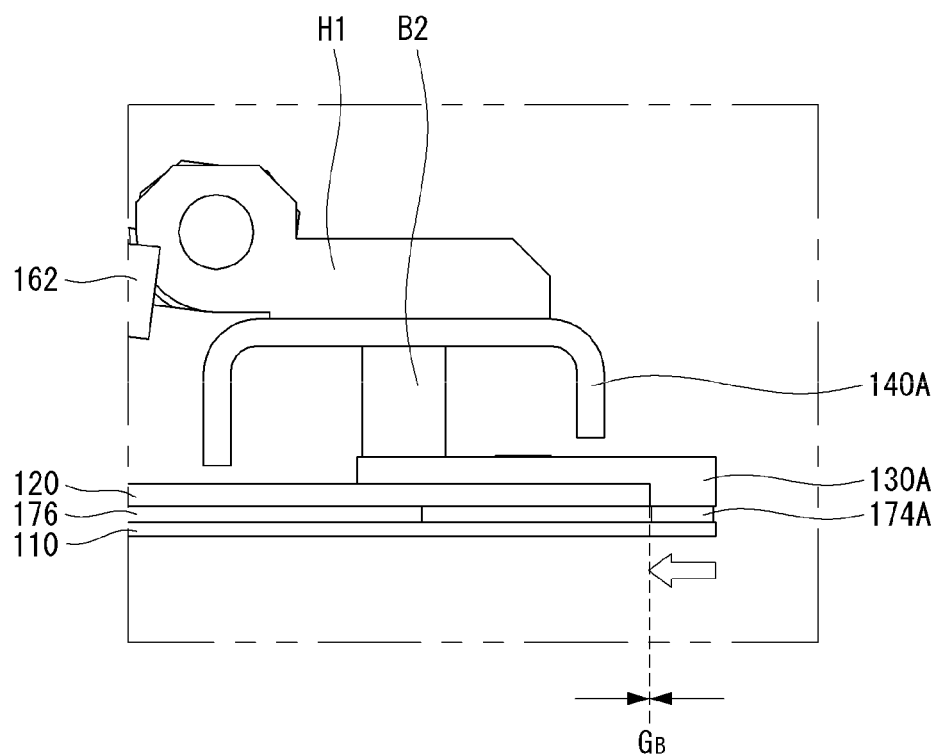

Referring to FIGS. 22 and 25, a curvature of the display panel 110 or the plate 120 may change by a movement of the wing plate 162. In this instance, the front surface of the display panel 110 or the plate 120 may be in a convex state (see "B" in FIG. 22). Further, a curvature of the display panel 110 may change, and at the same time a curvature of the plate 120 may change. Namely, a position of both ends of the display panel 110 and a position of both ends of the plate 120 may relatively change. Because the side frame 130A may move while being fixed to one end or both ends of the display panel 110, the side frame 130A may cover changes in a relative position between the display panel 110 and the plate 120 at one end or both ends.

In other words, when the front surface of the display panel 110 becomes convex by the movement of the wing plate 162, the front surface of the plate 120 may become convex. In this instance, one end or both ends of the display panel 110 may be positioned closer to the inside of the display device 100 than one end or both ends of the display panel 110 in a flat state. To this end, the side frame 130A may move closer to the plate 120, and a gap $G_B$ between the side frame 130A and the plate 120 may decrease compared to when the display panel 110 is in a flat state.

In spite of the changes in the curvature of the display panel 110 or the plate 120, the display panel 110 can be prevented from being damaged and can maintain a smooth curved surface by such a mechanism. Further, the wing plate 162 can increase a movable range of the changes in the curvature of the display panel 110 or the plate 120 because the hinge H1 is connected to the second bar 140A.

Figure 26:
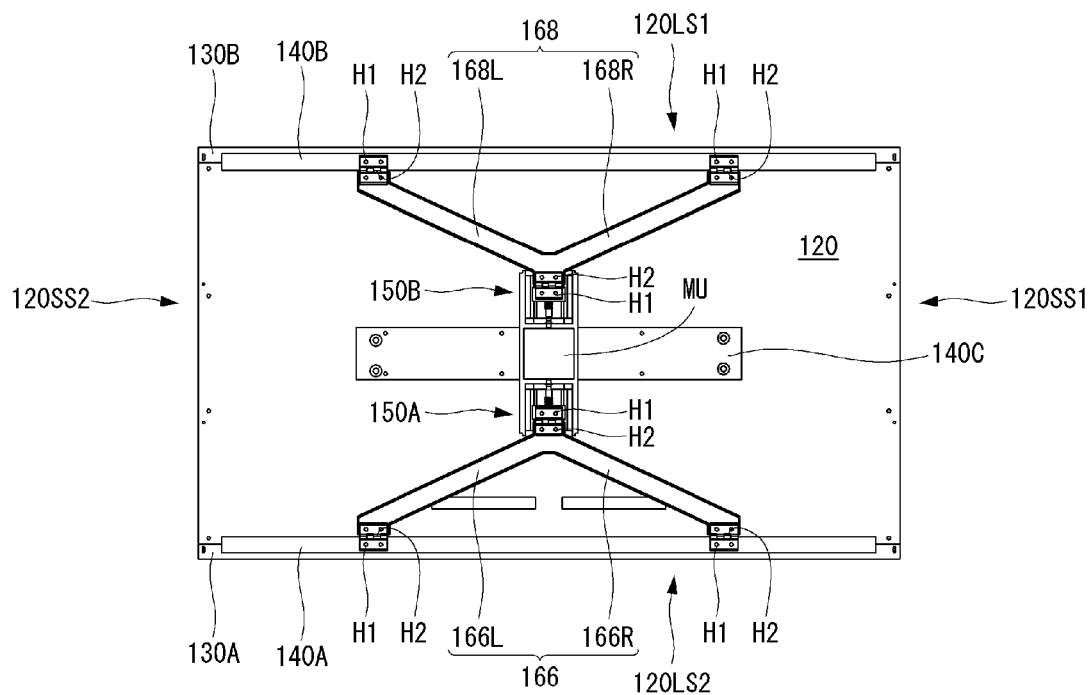
FIGS. 26 and 27 illustrate other examples of changes in a curvature of a display panel according to an embodiment of the invention.
Figure 27:
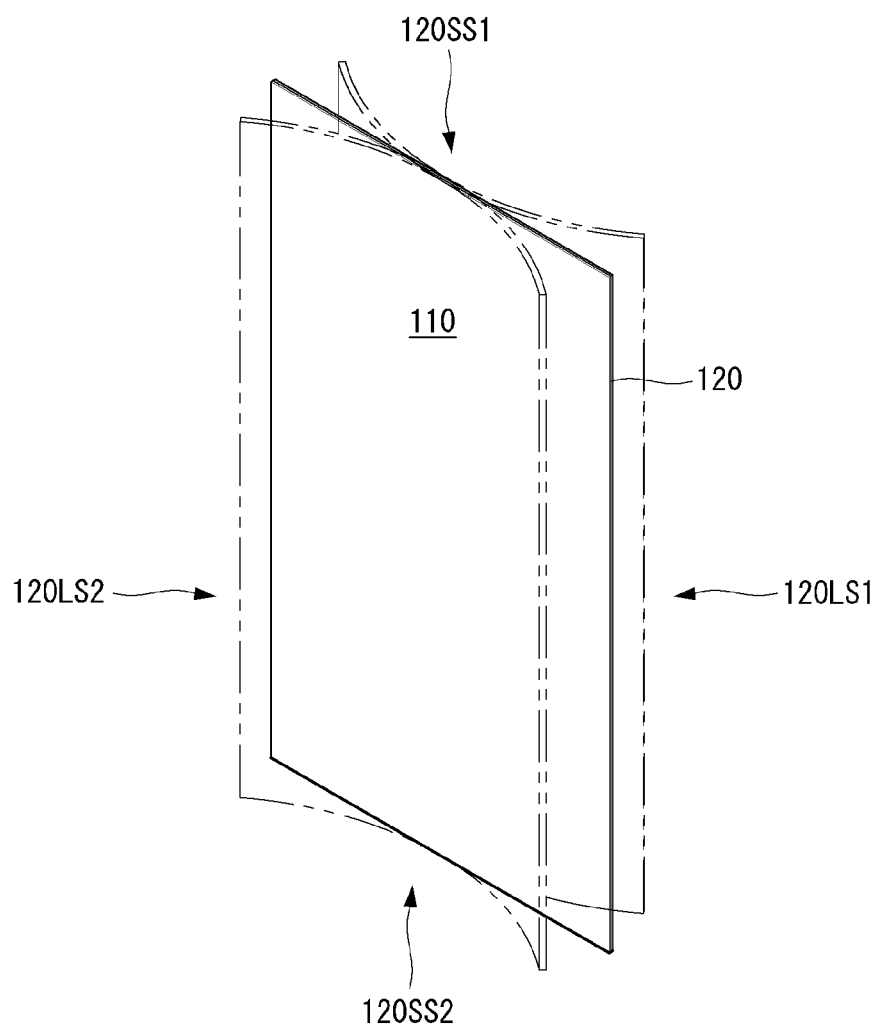

FIGS. 26 and 27 illustrate other examples of changes in a curvature of a display panel according to an embodiment of the invention.

Referring to FIG. 26, the first bar 140C may be extended in the left-right direction LR of the plate 120 and may be fixed to a center portion of the plate 120.

The first side frame 130A may be positioned on the second long side 120LS2 of the plate 120. The first side frame 130A may be installed or mounted so that it can move on the second long side 120LS2 of the plate 120. Namely, a gap may be provided between the first side frame 130A and the plate 120 at the second long side 120LS2 of the plate 120.

The second side frame 130B may be positioned on the first long side 120LS1 of the plate 120. The second side frame 130B may be installed or mounted so that it can move on the first long side 120LS1 of the plate 120. Namely, a gap may be provided between the second side frame 130B and the plate 120 at the first long side 120LS1 of the plate 120.

The wing plate 166 may include a first wing 166L and a second wing 166R, and the wing plate 168 may include a first wing 168L and a second wing 168R. The first wings 166L and 168L may be gradually far away from the second wings 166R and 168R as they go from the center portion of the plate 120 to the long sides 120LS2 and 120LS1 of the plate 120. For example, the wing plates 166 and 168 may entirely have a V-shape or a Y-shape.

The first wing plate 166 may connect the first drive unit 150A to the second bar 140A. One end or one side of the first wing plate 166 may be connected to the mover 159 of the first drive unit 150A by the hinges H1 and H2. The other end or the other side of the first wing plate 166 may be connected to the second bar 140A by the hinges H1 and H2. In this instance, the first wing plate 166 may be connected to the second bar 140A by the hinges H1 and H2 in a state where the first wing 166L and the second wing 166R are spaced apart from each other.

The second wing plate 168 may connect the second drive unit 150B to the third bar 140B. One end or one side of the second wing plate 168 may be connected to the mover 159 of the second drive unit 150B by the hinges H1 and H2. The other end or the other side of the second wing plate 168 may be connected to the third bar 140B by the hinges H1 and H2. In this instance, the second wing plate 168 may be connected to the third bar 140B by the hinges H1 and H2 in a state where the first wing 168L and the second wing 168R are spaced apart from each other.

Hence, a force for changing the curvature of the display panel 110 may be uniformly distributed and transferred to the first long side 120LS1 or the second long side 120LS2 of the plate 120. In other words, when the curvature of the display panel 110 changes, flatness of the long side of the display panel 110 can be secured.

Referring to FIG. 27, when the display device is in a portrait view state, the curvature of the display panel 110 may change in concavity or convexity.

Figure 28:
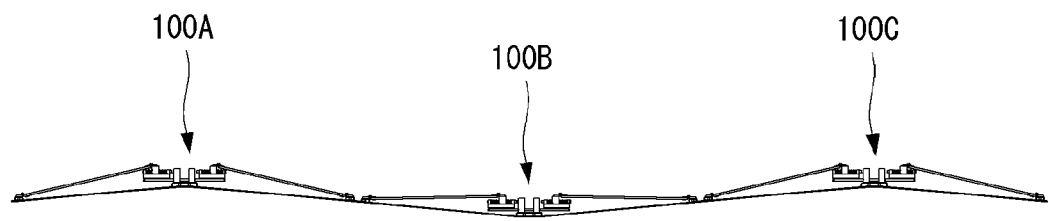
FIGS. 28 to 30 illustrate examples of a plurality of curvature variable display devices according to an embodiment of the invention.
Figure 29:
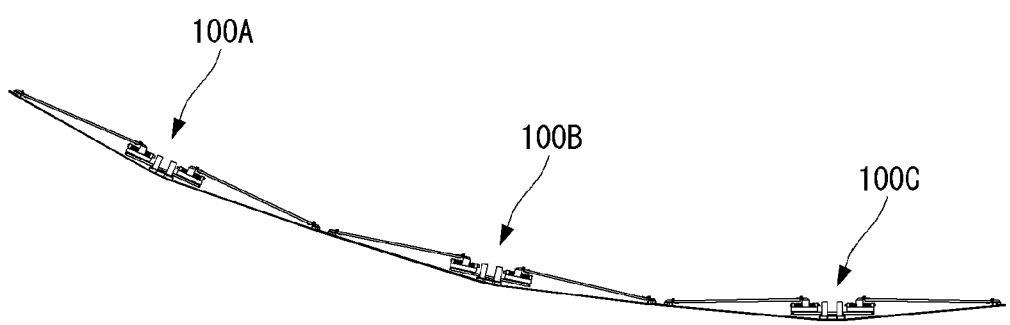
Figure 30:
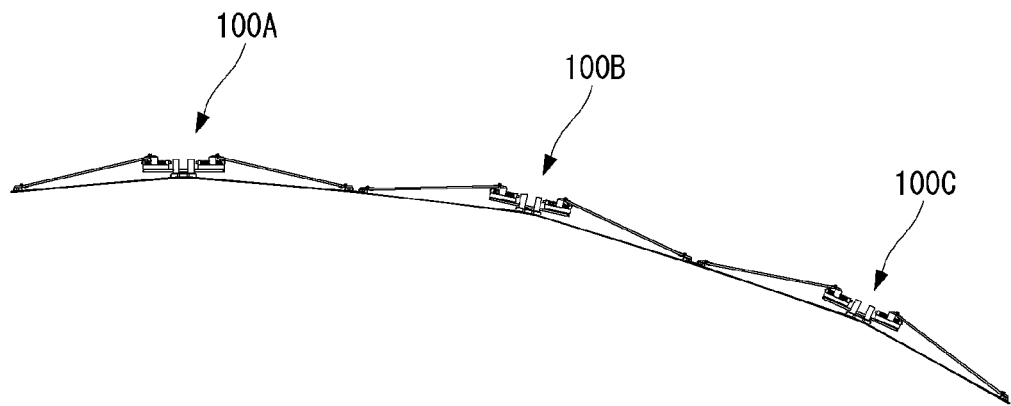

FIGS. 28 to 30 illustrate examples of a plurality of curvature variable display devices according to an embodiment of the invention.

Referring to FIG. 28, a plurality of display devices 100A, 100B, and 100C may be connected to one another. The plurality of display devices 100A, 100B, and 100C may be disposed in series. The plurality of display devices 100A, 100B, and 100C may include a first display device 100A, a second display device 100B, and a third display device 100C.

The first display device 100A may be configured so that a display panel 110 has a concave front surface. The second display device 100B may be configured so that a display panel 110 has a convex front surface. The third display device 100C may be configured so that a display panel 110 has a concave front surface.

Referring to FIG. 29, all of the plurality of display devices 100A, 100B, and 100C may be configured so that all of their display panels have a convex front surface, and may be disposed in series.

Referring to FIG. 30, all of the plurality of display devices 100A, 100B, and 100C may be configured so that all of their display panels have a concave front surface, and may be disposed in series.

In one aspect, there may be provided a display device including a flexible plate; a side frame positioned on one side of the flexible plate and separated from the flexible plate; a display panel positioned in front of the flexible plate, wherein a portion of the display panel is fixed to a portion of a front surface of the flexible plate and another portion of the display panel is fixed to the side frame; a drive unit installed to the rear of the flexible plate and providing an attraction force or a repulsion force for the side frame; and a wing plate having one side, that is hinge-connected to a portion of a back surface of the flexible plate adjacent to the side frame, and the other side hinge-connected to the drive unit.

According to another aspect of the present disclosure, the side frame and the flexible plate may form a gap. The gap may increase when the drive unit provides the repulsion force, and may decrease when the drive unit provides the attraction force.

According to another aspect of the present disclosure, the side frame may include a guide groove that is extended along a longitudinal direction of the wing plate. The flexible plate may include a guide pin inserted into the guide groove.

According to another aspect of the present disclosure, the guide pin may be rivet-coupled to the guide groove.

According to another aspect of the present disclosure, the display device may further include a center rigid bar fixed to the back surface of the flexible plate and a side rigid bar that is adjacent to the side frame and is fixed to the back surface of the flexible plate. The drive unit may be mounted on the center rigid bar, and one side of the wing plate may be coupled to the side rigid bar.

According to another aspect of the present disclosure, the drive unit may include a housing, a guide rail installed to the housing, a slider performing a linear motion on the guide rail, and a lead shaft that is mounted on the housing, penetrates the slider, and is screw-coupled to the slider. The wing plate may be hinge-coupled to the slider.

According to another aspect of the present disclosure, the display device may further include a center adhesive member extended vertically in a center portion of the front surface of the flexible plate and fixed to the center portion, and a side adhesive member extendedly fixed to a front surface of the side frame. A back surface of the display panel may be fixed to the center adhesive member and the side adhesive member.

According to another aspect of the present disclosure, the display device may further include a coupling member fixed to the front surface of the flexible plate, positioned between the center adhesive member and the side adhesive member, and having a magnetic force. The back surface of the display panel may contact the coupling member.

According to another aspect of the present disclosure, the side frame may be positioned on a short side of the flexible plate.

According to another aspect of the present disclosure, the side frame may be positioned on a long side of the flexible plate. The wing plate may include a first wing and a second wing that is gradually far away from the first wing as the wing plate is close to the side frame. The first and second wings may be hinge-coupled to the side frame.

According to another aspect of the present disclosure, the display device may further include a cable electrically connected to the display panel. The flexible plate may include a slot, and the cable may be inserted into the slot.

According to another aspect of the present disclosure, the display device may further include a center rigid bar fixed to the back surface of the flexible plate and a controller installed to the center rigid bar. The cable may be electrically connected to the controller.

According to another aspect of the present disclosure, the wing plate may include a flat portion extended from the drive unit to the side frame and a side wall that is formed along a longitudinal direction of the flat portion and bends from the flat portion.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a flexible display panel;
    a flexible plate disposed at a rear side of the flexible display panel;
    a rigid bar disposed at a rear side of the flexible plate and adjacent to an edge of the flexible plate;
    a drive unit disposed at the rear side of the flexible plate; and
    a wing plate coupling the drive unit to the rigid bar, wherein the wing plate is hingedly coupled to the rigid bar;
    a side frame disposed adjacent to an edge of the flexible plate wherein a portion of the side frame is separated from the flexible plate;
    a side adhesive member disposed at a front side of the side frame; and
    a magnetic coupling member disposed at a part of a front side of the flexible plate,
    wherein a part of a rear surface of the flexible display panel is attached to the side adhesive member, and
    wherein another part of the rear surface of the flexible display panel is in contact with the magnetic coupling member.

2. The display device of claim 1, further comprising a side frame disposed between the flexible display panel and the rigid bar.

3. The display device of claim 2, wherein the drive unit is configured to apply a force to the side frame in a first direction or a second direction.

4. The display device of claim 3, wherein an edge of the side frame is separated from an edge of the flexible plate by a gap.

5. The display device of claim 4, wherein a width of the gap increases when the drive unit applies the force in the first direction and decreases when the drive unit applies the force in the second direction.

6. The display device of claim 1, wherein the drive unit is configured to apply a force to the rigid bar in a first direction or a second direction via the wing plate.

7. The display device of claim 6, wherein the edge of the flexible plate is moved such that a rear side of the flexible plate is concave when the drive unit applies the force in the second direction.

8. The display device of claim 6, wherein the edge of the flexible plate is moved such that a front side of the flexible plate is concave when the drive unit applies the force in the first direction.

9. The display device of claim 1, further comprising a side frame disposed between the flexible display panel and the rigid bar,
wherein the flexible plate comprises a boss disposed at the rear side of the flexible plate and adjacent to the rigid bar, and
wherein the side frame comprises a groove corresponding to the boss.

10. The display device of claim 9, wherein:
the drive unit is configured to apply a force to the rigid bar via the wing plate in a first direction or a second direction;
the boss is moved toward the groove when the drive unit applies the force in the first direction; and
the boss is moved away from the groove when the drive unit applies the force in the second direction.

11. The display device of claim 1, further comprising a side frame disposed between the flexible display panel and the rigid bar,
wherein the side frame comprises a guide groove extending parallel to a longitudinal direction of the wing plate; and
wherein the flexible plate comprises a guide pin disposed at the rear side of the flexible plate and configured to be inserted into the guide groove.

12. The display device of claim 11, wherein:
the drive unit is configured to apply a force to the rigid bar in a first direction or a second direction via the wing plate; and
the guide pin is configured to travel along the guide groove when the force is applied by the drive unit.

13. The display device of claim 1, further comprising a center rigid bar disposed between the flexible plate and the drive unit.

14. The display device of claim 1, wherein the drive unit further comprises:
a housing;
a guide rail;
a slider configured to travel along the guide rail; and
a lead shaft mounted on the housing and screw-coupled to the slider,
wherein the wing plate is hingedly coupled to the slider.

15. The display device of claim 14, further comprising a center rigid bar disposed at the rear side of the flexible plate,
wherein the drive unit is mounted on the center rigid bar.

16. The display device of claim 1, further comprising:
a center adhesive member disposed at a center portion of the front side of the flexible plate and coupled to the center portion,
wherein the center adhesive member and the side adhesive member are coupled to a rear side of the flexible display panel.

17. The display device of claim 16, wherein the magnetic coupling member is disposed between the center adhesive member and the side adhesive member at the front side of the flexible plate.

18. The display device of claim 16, wherein the center adhesive member extends vertically at the center portion and the side adhesive member extends vertically at the front side of the side frame.

19. The display device of claim 1, further comprising a boss disposed at the rear side of the flexible plate,
wherein the rigid bar is coupled to the boss by a fastening member.

* * * * *